United States Patent [19]

Kawata et al.

[11] Patent Number: 6,013,407
[45] Date of Patent: Jan. 11, 2000

[54] POSITIVE RESIST COMPOSITION

[75] Inventors: Shoji Kawata; Hiroshi Hayashi; Hirokazu Higashi; Takeyoshi Kato; Masahiro Nakamura, all of Kanagawa, Japan

[73] Assignee: Nippon Zeon Co., Ltd., Tokyo, Japan

[21] Appl. No.: 08/875,045

[22] PCT Filed: Jan. 17, 1996

[86] PCT No.: PCT/JP96/00061

§ 371 Date: Jul. 8, 1997

§ 102(e) Date: Jul. 8, 1997

[87] PCT Pub. No.: WO96/22563

PCT Pub. Date: Jul. 25, 1996

[30] Foreign Application Priority Data

Jan. 17, 1995 [JP] Japan .................................... 7-22273
Feb. 20, 1995 [JP] Japan .................................... 7-55032
Apr. 26, 1995 [JP] Japan .................................... 7-125985

[51] Int. Cl.$^7$ .................................................. G03F 7/023
[52] U.S. Cl. .......................... 430/191; 430/165; 430/192; 430/193
[58] Field of Search ................................. 430/191, 192, 430/193, 165

[56] References Cited

U.S. PATENT DOCUMENTS

| | | | |
|---|---|---|---|
| 5,112,712 | 5/1992 | Yamada et al. | 430/191 |
| 5,238,775 | 8/1993 | Kajita et al. | 430/191 |
| 5,275,910 | 1/1994 | Moriuma et al. | 430/191 |
| 5,340,686 | 8/1994 | Sakaguchi et al. | 430/192 |
| 5,407,779 | 4/1995 | Uetani et al. | 430/792 |
| 5,424,167 | 6/1995 | Uetani et al. | 430/192 |
| 5,451,484 | 9/1995 | Nagase et al. | 430/192 |
| 5,541,033 | 7/1996 | Blakeney et al. | 430/192 |

FOREIGN PATENT DOCUMENTS

| | | |
|---|---|---|
| 0249139 | 12/1987 | European Pat. Off. . |
| 0541112 | 5/1993 | European Pat. Off. . |
| 0598320 | 5/1994 | European Pat. Off. . |
| 0689097 | 12/1995 | European Pat. Off. . |
| 59-46917 | 11/1984 | Japan . |
| 3-200252 | 9/1991 | Japan . |
| 4-122938 | 4/1992 | Japan . |
| 5-127374 | 5/1993 | Japan . |
| 5-204149 | 8/1993 | Japan . |
| 5-232697 | 9/1993 | Japan . |
| 6-116370 | 4/1994 | Japan . |
| 6-167805 | 6/1994 | Japan . |
| 6-289607 | 10/1994 | Japan . |
| 7-72622 | 3/1995 | Japan . |
| 7-271022 | 10/1995 | Japan . |
| 7-306532 | 11/1995 | Japan . |
| 7-333843 | 12/1995 | Japan . |

OTHER PUBLICATIONS

Patent Abstract of Japan based on Publication No. 5–323602 dated Dec. 7, 1993.
Patent Abstract of Japan based on Publication No. 6–266107 dated Sep. 22, 1994.
Patent Abstract of Japan based on Publication No. 8–179502 dated Jul. 12, 1996.
Communication from the EPO containing Supplementary European Search Report for Appln. No. EP 96 90 0700 dated Jul. 5, 1999.

Primary Examiner—John S. Chu
Attorney, Agent, or Firm—Dinsmore & Shohl LLP

[57] ABSTRACT

A positive resist composition is excellent in sensitivity, film loss after development, resolution, thermal-flow resistance, storage stability, exposure margin and focus margin and comprises in combination (A) an alkali-soluble phenol resin, (B) a quinonediazide sulfonate type photosensitive agent and (C) a phenolic compound, wherein the phenolic compound (C) is at least one phenolic compound selected from the group consisting of phenolic compounds (CX) having a structural unit represented by the following formula (I) and phenolic compounds (CD) having a structural unit represented by the following formula (II):

wherein $R^1$ to $R^3$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, $R^4$ to $R^{11}$ are, independently of one another, a hydrogen atom, an alkyl group which may be substituted, a cycloalkyl group which may be substituted, an alkenyl group which may be substituted, an aryl group which may be substituted, or an alkoxy group which may be substituted, and n is a positive integer; and wherein $R^{12}$ to $R^{15}$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, with the proviso that at least one of $R^{12}$ to $R^{15}$ is a hydroxyl group, and m is a positive integer.

16 Claims, No Drawings

POSITIVE RESIST COMPOSITION

TECHNICAL FIELD

The present invention relates to a positive resist composition, and more particularly to a positive resist composition suitable for use in minute processing required for the fabrication of semiconductor devices, magnetic bubble memory devices, integrated circuits and the like.

BACKGROUND ART

In recent years, positive resist compositions have been mainly used as resist compositions for forming semiconductor devices. The reason for it is that a negative resist composition generally has high sensitivity, but involves a drawback in resolution because it is developed with an organic solvent, so that it swells to a significant extent. On the other hand, positive resist compositions are believed that they can be satisfactorily accommodated to the integration of semiconductors to a high degree because they are generally excellent in resolution. The positive resist compositions heretofore commonly used in this field are those composed of an alkali-soluble phenol resin such as a novolak resin, and a quinonediazide sulfonic acid type photosensitive agent. These positive resist compositions can be developed with an aqueous solution of an alkali and so undergo no swelling and have excellent resolution. In recent years, the resolution of such a positive resist composition has been more enhanced by improvement in its own performance and the development of a higher-performance aligner, so that formation of a minute pattern having a line width of 1 μm or smaller has come to be feasible.

With respect to various properties such as sensitivity, film loss after development, resolution, thermal-flow resistance and storage stability, however, satisfactory results are not necessarily obtained from the conventional positive resist compositions. It is thus desired that the performance of the positive resist compositions be further enhanced. In the formation of, in particular, a minute pattern having a line width of 0.8 μm or smaller, preferably 0.5 μm or smaller, it is necessary to more strictly control resist dimensions. There is accordingly a strong demand for development of a positive resist composition capable of achieving higher dimensional accuracy. There is also a demand for development of a positive resist composition which undergoes little dimensional changes by variations of exposure and focal deviation of exposure light, namely, is good in the so-called exposure margin or focus margin.

From such a point of view, it has been proposed to use, as an additive for modifying resist properties, various kinds of phenolic compounds for positive resist compositions comprising an alkali-soluble phenol resin and a quinonediazide sulfonate type photosensitive agent (Japanese Patent Application Laid-Open Nos. 200252/1991, 122938/1992, 127374/1993 and 232697/1993). However, the positive resist compositions specifically disclosed in these documents are somewhat insufficient in resist properties such as sensitivity, resolution and film loss after development. There is thus a demand for development of a further improved positive resist composition. The improvement of these various properties is extremely important in processing of, in particular, gates, holes, wiring layers and the like, which are difficult to control dimensions because of high reflectance of substrates.

In order to prevent the reduction of accuracy in dimensional control by reflection of exposure light from a substrate, there has also been proposed a methods of reducing the reflectance of a substrate by forming a film on the substrate with an inorganic substance by a CVD process or a PVP process or by coating the substrate with a film of a resin to which a suitable light absorbing component has been added. However, it has not been yet successful to achieve sufficient resist properties on such a substrate by the conventional positive resist compositions. There is therefore a demand for development of a positive resist composition capable of achieving satisfactory resist properties even on such a reflectance-reduced substrate.

DISCLOSURE OF THE INVENTION

It is an object of the present invention to provide a positive resist composition which is excellent in various properties such as sensitivity, film loss after development, resolution, thermal-flow resistance and storage stability.

Another object of the present invention is to provide a positive resist composition which is excellent in the above-described various resist properties and improved in exposure margin and focus margin.

A further object of the present invention is to provide a positive resist composition which can exhibit the excellent resist properties even when it is applied to a substrate the reflectance of which has been reduced.

The present inventors have carried out an extensive investigation with a view toward overcoming the above-described problems. As a result, it has been found that the above objects can be achieved by using a certain specific phenolic compound, thus leading to completion of the present invention.

According to the present invention, there is thus provided a positive resist composition comprising in combination (A) an alkali-soluble phenol resin, (B) a quinonediazide sulfonate type photosensitive agent and (C) a phenolic compound, wherein the phenolic compound (C) is at least one phenolic compound selected from the group consisting of phenolic compounds (CX) having a structural unit represented by the following formula (I) and phenolic compounds (CD) having a structural unit represented by the following formula (II):

wherein $R^1$ to $R^3$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, $R^4$ to $R^{11}$ are, independently of one another, a hydrogen atom, an alkyl group which may be substituted, a cycloalkyl group which may be substituted, an alkenyl group which may be substituted, an aryl group which may be substituted, or an alkoxy group which may be substituted, and n is a positive integer; and wherein $R^{12}$ to $R^{15}$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, with the proviso that at least one of $R^{12}$ to $R^{15}$ is a hydroxyl group, and m is a positive integer.

BEST MODE FOR CARRYING OUT THE INVENTION

The present invention will hereinafter be described in detail.

(A) Alkali-Soluble Phenol Resin

In the present invention, a single alkali-soluble phenol resin may be used, or two or more alkali-soluble phenol resins may be used in combination.

Examples of the alkali-soluble phenol resins include condensation products of a phenol and an aldehyde, condensation products of a phenol and a ketone, vinylphenol polymers, isopropenylphenol polymers, and hydrogenation products of these phenol resins. These phenol resins may be used in combination. Of these, novolak resins obtained by a condensation reaction of a phenol with an aldehyde are particularly preferred.

Specific examples of the phenol used herein include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-methylresorcinol, 4-methylresorcinol, 5-methylresorcinol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methyl-phenol, 2-t-butyl-5-methylphenol, thymol and isothymol. Of these, o-cresol, m-cresol, p-cresol, 2,3-dimethyl-phenol, 2,5-dimethylphenol, 3,4-dimethylphenol, 3,5-dimethylphenol, 2,3,5-trimethylphenol and 3,4,5-trimethylphenol are preferred. These compounds may be used singly, but two or more thereof may also be used in combination. In particular, combinations of m-cresol, p-cresol and 3,5-dimethylphenol and of m-cresol, p-cresol and 2,3,5-trimethylphenol are preferred.

Specific examples of the aldehyde include formalin, paraformaldehyde, trioxane, acetaldehyde, propyl aldehyde, benzaldehyde, phenylacetaldehyde, a-phenylpropyl aldehyde, β-phenylpropyl aldehyde, o-hydroxybenzaldehyde, m-hydroxybenzaldehyde, p-hydroxybenzaldehyde, o-chloro-benzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbanzaldehyde, p-n-butylbenz-aldehyde and terephthalaldehyde. Of these, formalin, paraformaldehyde, acetaldehyde and benzaldehyde are preferred. These compounds may be used either singly or in any combination thereof.

Specific examples of the ketone include acetone, acetophenone, o-hydroxyacetophenone, m-hydroxyacetophenone, p-hydroxyacetophenone, 2,4-dihydroxyacetophenone, methyl ethyl ketone, diethyl ketone and diphenyl ketone. These compounds may be used either singly or in any combination thereof.

These condensation products can be obtained in accordance with a method known per se in the art, for example, by reacting a phenol and an aldehyde or a ketone in the presence of an acid catalyst.

The vinylphenol polymer is selected from among a homopolymer of vinylphenol, and copolymers of vinylphenol and a component copolymerizable therewith. The isopropenylphenol polymer is selected from among a homopolymer of isopropenylphenol, and copolymers of isopropenylphenol and a component copolymerizable therewith. Specific examples of the component copolymerizable with vinylphenol or isopropenylphenol include acrylic acid, methacrylic acid, styrene, maleic anhydride, maleinimide, vinyl acetate, acrylonitrile and derivatives thereof. The copolymers can be obtained in accordance with any of well known methods.

The hydrogenated products of the phenol resins can be obtained in accordance with a method known per se in the art, for example, by dissolving any of the above-described phenol resins in an organic solvent and subjecting the solution to hydrogenation in the presence of a homogeneous or heterogeneous catalyst.

The weight average molecular weight (hereinafter referred to as "average molecular weight" merely) of the alkali-soluble phenol resin useful in the practice of the present invention varies according to the kind of the resin and the preparation process thereof, but is generally 2,000–25,000, preferably 3,500–20,000 as determined in terms of polystyrene according to a GPC pattern making use of a UV detector at 254 nm. If the average molecular weight of the phenol resin is lower than 3,500, the resulting resist composition tends to deteriorate its pattern profile, resolution and developability. Any phenol resin having an average molecular weight lower than 2,000 is not practical. If the average molecular weight exceeds 20,000, the pattern profile, developability and sensitivity of the resulting resist composition are deteriorated. In particular, any phenol resin having an average molecular weight exceeding 25,000 is not practical.

These alkali-soluble phenol resins may also be used after its molecular weight and molecular weight distribution are controlled by a known means. Methods of controlling the molecular weight and molecular weight distribution include a method in which the resin is ground and subjected to solid-liquid extraction with an organic solvent having a suitable solubility, and a method in which the resin is dissolved in a good solvent, and the solution is added dropwise to a poor solvent, or the poor solvent is added dropwise to the solution, thereby conducting solid-liquid extraction or liquid—liquid extraction.

(B) Quinonediazide Sulfonate Type Photosensitive Agent

The photosensitive agent useful in the practice of the present invention is the quinonediazide sulfonate of a polyhydroxy compound. This ester may not be a compound obtained by esterifying all the hydroxyl groups in a molecule of the polyhydroxy compound, but may be a partially esterified product thereof.

Specific examples of the esterified product used as the photosensitive agent include the 1,2-benzoquinone-diazide-4-sulfonates, 1,2-naphthoquinonediazide-4-sulfonates, 1,2-naphthoquinonediazide-5-sulfonates, 1,2-naphthoquinonediazide-6-sulfonates, 2,1-naphthoquinone-diazide-4-sulfonates, 2,1-naphthoquinonediazide-5-sulfonates and 2,1-naphthoquinonediazide-6-sulfonates of polyhydroxy compounds.

The quinonediazide sulfonates of the polyhydroxy compounds can be obtained by converting a quinonediazide sulfonic compound into a quinonediazide sulfonyl halide in accordance with a method known per se in the art and reacting the thus-obtained quinonediazide sulfonyl halide with a polyhydroxy compound in the presence of an inorganic base such as sodium carbonate, sodium hydrogencarbonate, sodium hydroxide or potassium hydroxide, or an organic base such as trimethylamine, triethylamine, tripropylamine, diisopropylamine, tributylamine, pyrrolidine, piperidine, piperadine pyridine, morpholine, pyridine or dicyclohexylamine in a solvent such as acetone, dioxane or tetrahydrofuran.

As the hydroxy compound used herin, any known compound having phenolic hydroxyl groups may be used. Specific examples thereof include polyhydroxy-benzophenones such as 2,3,4-trihydroxybenzophenone, 2,4,4'-trihydroxybenzophenone, 2,3,4,4'-tetrahydroxybenzophenone, 2,4,2',4'-tetrahydroxybenzophenone and 2,3,4,2',4'-pentahydroxybenzophenone; gallic acid esters such as methyl gallate, ethyl gallate and propyl gallate; polyhydroxybisphenylalkanes such as 2,2-bis(4-hydroxy-phenyl) propane and 2,2-bis(2,4-dihydroxyphenyl)propane; polyhydroxytrisphenylalkanes such as tris(4-hydroxy-phenyl) methane, 1,1,1-tris(4-hydroxy-3-methylphenyl)-ethane, 1,1,1-tris(4-hydroxy-3-ethylphenyl)-ethane, 1,1,1-tris(4-hydroxyphenyl)ethane, 1,1-bis(4-hydroxy-3-methylphenyl)-1-(4-hydroxyphenyl)ethane and bis(4-hydroxy-3-methylphenyl)-2-hydroxy-4-methoxyphenylmethane; polyhydroxytetrakisphenylalkanes such as 1,1,2,2-tetrakis(4-hydroxyphenyl)ethane, 1,1,2,2-tetrakis(3-methyl-4-hydroxyphenyl)ethane and 1,1,3,3-tetrakis(4-hydroxyphenyl)propane; polyhydroxytetrakisphenylxylenes such as α, α,α',α'-tetrakis(4-hydroxyphenyl)-3-xylene, α,α,α',α'-tetrakis(4-hydroxyphenyl)-4-xylene and α,α,αα'-tetrakis(3-methyl-4-hydroxyphenyl)-3-xylene; and trimers of phenols such as 2,6-bis(2,4-dihydroxy-benzyl)-p-cresol, 2,6-bis(2,4-dihydroxy-3-methylbenzyl)-p-cresol, 4,6-bis(4-hydroxybenzyl)resorcin, 4,6-bis(4-hydroxy-3-methylbenzyl)resorcin, 4,6-bis(4-hydroxybenzyl)-2-methylresorcin and 4,6-bis(4-hydroxy-3-methylbenzyl)-2-methylresorcin with formalin, trimers of phenols represented by the following formula (III) with formalin, and novolak resins.

wherein $R^{16}$ and $R^{17}$ are, independently of each other, a hydrogen atom or an alkyl group having 1–4 carbon atoms, and $R^{18}$ to $R^{21}$ are, independently of one another, an alkyl group having 1–4 carbon atoms.

In the photosensitive agent useful in the practice of the present invention, no particular limitation is imposed on the esterification degree (average esterification degree) of the quinonediazide sulfonic compound to the polyhydroxy compound. However, its lower limit is generally 20%, preferably 30%, and its upper limit is generally 100%, preferably 95%, both, as expressed in terms of mol % of the quinonediazide sulfonic compound to the hydroxyl groups of the polyhydroxy compound. The esterification degree is generally 20–100%, preferably 30–95%. Any esterification degree too low may possibly invite the deterioration in pattern profile and resolution. On the other hand, any esterification degrees too high may possibly invite the lowering of sensitivity.

The quinonediazide sulfonate type photosensitive agents may be used either singly or in any combination thereof. The proportion of the photosensitive agent to be incorporated is generally 1–100 parts by weight, preferably 3–40 parts by weight per 100 parts by weight of the alkali-soluble phenol resin (A). Any proportion lower than 1 part by weight results in a positive resist composition which is difficult to form any resist pattern. On the other hand, any proportion exceeding 100 parts by weight results in a positive resist composition which has lowered sensitivity and tends to cause insolubilization of exposed portions upon developing.

(C) Phenolic Compound

In the present invention, a compound [phenolic compound (CX)] having a structural unit represented by the formula (I) and a compound [phenolic compound (CD)] having a structural unit represented by the formula (II) are used as the phenolic compound of a modifier for the positive resist composition. The phenolic compounds (CX) and (CD) may be used singly. However, the combined use of both compounds permits the provision of a positive resist composition more improved in exposure margin and focus margin.

The phenolic compound (CX) can be obtained by condensing a phenol with an α,α'-disubstituted xylene in the presence of an acid catalyst. More specifically, such a phenolic compound (CX) can be synthesized in accordance with a process disclosed in, for example, Japanese Patent Publication No. 46917/1984 or Japanese Patent Application Laid-Open No. 116370/1994.

No particular limitation is imposed on the phenol used as a raw material for the phenolic compound (CX). However, preferable examples thereof include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol and isothymol. These compounds may be used either singly or in any combination thereof.

No particular limitation is imposed on the α,α'-disubstituted xylene. However, preferable examples thereof include o-xylylene glycol, m-xylylene glycol, p-xylylene glycol, o-divinylbenzene, m-divinylbenzene, p-divinylbenzene, o-xylylene glycol ditoluenesulfonate, m-xylylene glycol ditoluenesulfonate, p-xylylene glycol ditoluenesulfonate, o-xylylene glycol dimesylate, m-xylylene glycol dimesylate, p-xylylene glycol dimesylate, o-diisopropylbenzene, m-diisopropylbenzene, p-diisopropylbenzene, 2,3,5,6-tetramethyl-p-xylylene glycol, 2,5-dimethyl-p-xylylene glycol, α,α'-dimethoxy-p-xylene, α,α'-dimethoxy-m-xylene and α,α'-dimethoxy-o-xylene. These compounds may be used either singly or in any combination thereof.

Specific examples of such a phenolic compound (CX) include those shown in Table 1. $R^1$ to $R^{11}$ shown in Table 1 correspond to those defined in the formula (I). The phenolic compound (CX) contains at least one structural unit represented by the formula (I).

TABLE 1

|  | C-1 | C-2 | C-3 | C-4 | C-5 | C-6 | C-7 | C-8 |
|---|---|---|---|---|---|---|---|---|
| Formula (I) | | | | | | | | |
| $R^1$ | H | $CH_3$ | $CH_3$ | $CH_3$ | OH | OH | OH | Cyclohexyl |
| $R^2$ | H | H | $CH_3$ | $CH_3$ | H | $CH_3$ | OH | H |
| $R^3$ | H | H | H | $CH_3$ | H | H | H | H |
| $R^4$ | H | H | H | H | H | H | H | H |
| $R^5$ | H | H | H | H | H | H | H | H |
| $R^6$ | H | H | H | H | H | H | H | H |
| $R^7$ | H | H | H | H | H | H | H | H |
| $R^8$ | H | H | H | H | H | H | H | H |
| $R^9$ | H | H | H | H | H | H | H | H |
| $R^{10}$ | H | H | H | H | H | H | H | H |
| $R^{11}$ | H | H | H | H | H | H | H | H |

As specific examples of the phenolic compound (CX), may be mentioned those having a structural unit represented by each of the following formulae (CX-I) to (CX-XVI):

As the phenolic compound (CD), there may be used a compound obtained by reacting the phenol and dicyclopentadiene in coexistence with an aldehyde or ketone which is used as a raw material for a novolak resin. The aldehyde is preferably formaldehyde. When the aldehyde or ketone is used in combination, the proportion of dicyclopentadiene to be used is at least 20 parts by weight, preferably at least 50 parts by weight, more preferably at least 70 parts by weight, per 100 parts by weight of the total weight of the aldehyde, ketone and dicyclopentadiene.

Specific examples of such a phenolic compound (CD) include those shown in Tables 2 and 3. $R^{12}$ to $R^{15}$ shown in Tables 2 and 3 correspond to those defined in the formula (II). The phenolic compound (CD) contains at least one structural unit represented by the formula (II).

TABLE 2

|  | D-1 | D-2 | D-3 | D-4 | D-5 | D-6 | D-7 | D-8 | D-9 |
|---|---|---|---|---|---|---|---|---|---|
| Formula (II) | | | | | | | | | |
| $R^{12}$ | OH | OH | OH | OH | OH | OH | OH | OH | OH |
| $R^{13}$ | H | $CH_3$ | $CH_3$ | $CH_3$ | OH | OH | OH | H | $OCH_3$ |
| $R^{14}$ | H | H | $CH_3$ | $CH_3$ | H | $CH_3$ | OH | H | H |
| $R^{15}$ | H | H | H | $CH_3$ | H | H | H | H | H |

TABLE 3

|  | D-10 | D-11 | D-12 | D-13 | D-14 | D-15 | D-16 |
|---|---|---|---|---|---|---|---|
| Formula (II) | | | | | | | |
| $R^{12}$ | OH | OH | OH | OH | OH | OH | OH |
| $R^{13}$ | Cl | Phenyl | t-Butyl | t-Butyl | Phenyl-thio | 3-Propenyl | Cyclo-hexyl |
| $R^{14}$ | H | H | H | t-Butyl | H | H | H |
| $R^{15}$ | H | H | H | H | H | H | H |

-continued

The phenolic compound (CD) can be obtained by subjecting a phenol and dicyclopentadiene to an addition reaction in the presence of an acid catalyst.

No particular limitation is imposed on the phenol used as a raw material for the phenolic compound (CD). However, preferable examples thereof include the same compounds as the phenol compounds which may be used as raw materials for the phenolic compounds (CX).

Dicyclopentadiene is a dimer of cyclopentadiene. Although two isomers of an endo form and an exo form exist in such a dimer, dicyclopentadiene used as a raw material for the phenolic compound (CD) (resin) useful in the practice of the present invention may be any isomer or may also be a mixture of the two isomers. When the mixture of the isomers is used, no particular limitation is imposed on the proportions of the isomers.

No particular limitation is imposed on the weight average molecular weights (average molecular weight) of the phenolic compounds (CX) and (CD) useful in the practice of the present invention as determined in terms of polystyrene according to a GPC making use of a UV detector at 254 nm. Their average molecular weights may be optionally selected according to, for example, the kind and average molecular weight of the alkali-soluble phenol resin.

For example, when the phenolic compounds (CX) and (CD) are used as ordinary low-molecular phenolic compounds, the average molecular weights are generally lower than 2,000, preferably lower than 1,500. The concentration of portions having an average molecular weight of at least 2,000 is generally 40% or lower, preferably 30% or lower. When such low-molecular weight phenolic compounds (CX) and (CD) are used in combination with each other, the proportion of the phenolic compound (CD) to the phenolic compound (CX) is 0.1–10 times, preferably 0.2–5 times, more preferably 0.5–2 times.

When the phenolic compounds (CX) and (CD) are used as resins used in combination with the alkali-soluble phenol resin, the average molecular weights in the GPC charts of these resins are generally 2,000–25,000, preferably 3,500–20,000. The proportion (parts by weight) of the phenolic compounds (CX) and (CD) used as the resins used in combination with the alkali-soluble phenol resin is 0.1–10 times, preferably 0.5–5 times, more preferably 0.7–3 times as much as the alkali-soluble phenol resin.

The combined use of the phenolic compounds (CX) and (CD) in these proportions can achieve high exposure margin and focus margin. Of course, these phenolic compounds (CX) and (CD) may be used singly. In such a case, the molecular weight of the phenolic compound used is preferably lower.

It is allowable to use one of the phenolic compounds (CX) and (CD) as a resin and use the other as a low-molecular phenolic compound serving as an additive. In this case, the proportion of the alkali-soluble phenol resin to the phenolic compound (CX) or (CD) used as the resin used in combination with the alkali-soluble phenol resin and the proportion of additives, which will be described subsequently, to the phenolic compounds (CX) or (CD) used as the low-molecular phenolic compound are more important than the proportion of the phenolic compound (CX) to the phenolic compound (CD).

These phenolic compounds (CX) and (CD) may also be used after their molecular weights and molecular weight distributions are controlled by a known means. Methods of controlling the molecular weight and molecular weight distribution include the same methods as the above-described methods for controlling the molecular weight and molecular weight distribution of the alkali-soluble phenol resin.

(Additional Phenolic Compound)

In the present invention, a phenolic compound (hereinafter may be referred as "additional phenolic compound") other than the phenolic compounds (CX) and (CD) may be used in combination. High resist properties may be achieved in some cases by using an additional phenolic compound in combination. Specific examples of the additional phenolic compound usable in combination include monophenols such as p-phenylphenol and p-isopropylphenol; bisphenols such as biphenol, 4,4'-dihydroxydiphenyl ether, 4,4'-dihydroxybenzophenone, bisphenol A (product of Honshu Chemical Industry Co., Ltd.), bisphenol C (product of Honshu Chemical Industry Co., Ltd.), bisphenol E (product of Honshu Chemical Industry Co., Ltd.), bisphenol F (product of Honshu Chemical Industry Co., Ltd.), bisphenol AP (product of Honshu Chemical Industry Co., Ltd.), bisphenol M (product of Mitsui Petrochemical Industries, Ltd.), bisphenol P (product of Mitsui Petrochemical Industries, Ltd.), bisphenol Z (product of Honshu Chemical Industry Co., Ltd.), 1,1-bis(4-hydroxy-phenyl)cyclopentane, 9,9-bis(4-hydroxyphenyl) fluorene, 1,1-bis(5-methyl-2-hydroxy-phenyl)methane and 3,5-dimethyl-4-hydroxybenzylphenol; trisphenols such as 1,1,1-tris(4-hydroxyphenyl)methane, 1,1,1-tris(4-hydroxyphenyl)ethane, 1,1-bis(3-methyl-4-hydroxyphenyl)-1-(4-hydroxyphenyl)methane, 1,1-bis(2,5-dimethyl-4-hydroxyphenyl)-1-(2-hydroxyphenyl)methane, 1,1-bis(3,5-dimethyl-4-hydroxyphenyl)-1-(2-hydroxyphenyl)methane, 2,6-bis(5-methyl-2-hydroxybenzyl)-4-methylphenol, 2,6-bis(4-hydroxybenzyl)-4-methylphenol, 2,6-bis(3-methyl-4-hydroxybenzyl)-4-methylphenol, 2,6-bis(3,5-dimethyl-4-hydroxybenzyl)-4-methylphenol, Trisphenol-PA (product of Honshu Chemical Industry Co., Ltd.) and Trisphenol-TC (product of Honshu Chemical Industry Co., Ltd.); tetrakisphenols such as 1,1,2,2-tetrakis(4-hydroxy-phenyl)ethane, 1,1,2,2-tetrakis(3-methyl-4-hydroxy-phenyl)ethane, 1,1,3,3-tetrakis(4-hydroxy-phenyl) propane, 1,1,5,5-tetrakis(4-hydroxyphenyl)pentane, $\alpha,\alpha,\alpha',\alpha'$-tetrakis(4-hydroxyphenyl)-3-xylene, ($\alpha,\alpha,\alpha',\alpha'$-tetrakis (4-hydroxyphenyl)-4-xylene, $\alpha$, $\alpha,\alpha\alpha',\alpha'$-tetrakis-(3-methyl-4-hydroxyphenyl)-3-xylene and $\alpha,\alpha,\alpha',\alpha'$-tetrakis (3-methyl-4-hydroxyphenyl)-4-xylene; and pyrogallols such as pyrogallol and 5-methylpyrogallol. Of these, trisphenols, tetrakisphenols and pyrogallols are particularly preferred examples.

The proportion of these phenolic compounds (CX) and (CD) to be incorporated varies according to the composition, molecular weight and molecular weight distribution of the alkali-soluble phenol resin, the kinds and amounts of other additives, the average molecular weights of the phenolic compounds (CX) and (CD), and the like. However, with respect to the total amount of the low-molecular phenolic compounds having an average molecular weight lower than 2,000, the upper limit thereof is generally 100 parts by weight, preferably 60 parts by weight, more preferably 40 parts by weight, per 100 parts by weight of the total amount of the alkali-soluble phenol resin and the high-molecular weight phenolic compounds (CX) and/or (CD) used as a resin, while the lower limit thereof is generally 3 parts by weight, preferably 5 parts by weight, more preferably 10 parts by weight. The term "total amount of the low-molecular phenolic compounds having an average molecular weight lower than 2,000" as used herein means the whole weight of the additional phenolic compound if none of the phenolic compounds (CX) and (CD) having an average molecular weight lower than 2,000 are used, but denotes the whole weight of the phenolic compound (CX) and/or (CD) and the additional phenolic compound if the phenolic compound (CX) and/or (CD) having an average molecular weight lower than 2,000 is used. At this time, the weight ratio of the additional phenolic compound to the phenolic compound (CX) and/or (CD) having an average molecular weight lower than 2,000 is 0.5–5, preferably 0.3–3, more preferably 0.5–2.

(Solvent)

The positive resist composition according to the present invention is generally used in a state that it is dissolved in a solvent, in order to coat a substrate with the solution to form a resist film.

Specific examples of solvents usable in the present invention include ketones such as acetone, methyl ethyl ketone, cyclopentanone and cyclohexanone; alcohols such as n-propyl alcohol, isopropyl alcohol, n-butyl alcohol and cyclohexanol; ethers such as ethylene glycol dimethyl ether, ethylene glycol diethyl ether and dioxane; alcohol ethers such as ethylene glycol monomethyl ether and ethylene glycol monoethyl ether; esters such as propyl formate, butyl formate, propyl acetate, butyl acetate, methyl propionate, ethyl propionate, methyl butyrate, ethyl butyrate, methyl lactate and ethyl lactate; cellosolve esters such as cellosolve acetate, methyl cellosolve acetate, ethyl cellosolve acetate, propyl cellosolve acetate and butyl cellosolve acetate; propylene glycols such as propylene glycol, propylene glycol monomethyl ether acetate, propylene glycol monoethyl ether acetate and propylene glycol monobutyl ether; diethylene glycols such as diethylene glycol monomethyl ether, diethylene glycol monoethyl ether, diethylene glycol dimethyl ether and diethylene glycol diethyl ether; halogenated hydrocarbons such as trichloroethylene; aromatic hydrocarbons such as toluene and xylene; and polar solvents such as dimethylacetamide, dimethylformamide and N-methylacetamide. These solvents may be used either singly or in any combination thereof. These solvents are used in a sufficient amount to evenly dissolve the components (A) to (C) therein.

(Other Additives)

In order to improve the developability, storage stability and thermal-flow resistance of the positive resist composition according to the present invention, for example, a copolymer of styrene and acrylic acid, methacrylic acid or maleic anhydride, a copolymer of an alkene and maleic anhydride, a polymer of vinyl alcohol, a polymer of vinylpyrrolidone, rosin and/or shellac may be added to the positive resist composition as needed. The proportion of such polymers to be incorporated is 0–50 parts by weight, preferably 5–20 parts by weight per 100 parts by weight of the whole alkali-soluble phenol resin.

In the positive resist composition according to the present invention, may be contained one or more of compatible additives such as surfactants, storage stabilizers, sensitizers, anti-striation agents and plasticizers as needed.

Examples of the surfactants include polyoxyethylene alkyl ethers such as polyoxyethylene lauryl ether, polyoxyethylene stearyl ether and polyoxyethylene oleyl ether; polyoxyethylene aryl ethers such as polyoxyethylene octylphenyl ether and polyoxyethylene nonylphenyl ether; polyethylene glycol dialkyl esters such as polyethylene glycol dilaurate and polyethylene glycol distearate; fluorine-containing surfactants such as F TOP, EF301, EF303 and EF352 (products of New Akita Chemical Company), Megafac F171, F172, F173 and F177 (product of Dainippon Ink & Chemicals, Incorporated), Fluorad FC430 and FC431 (products of Sumitomo 3M Limited), and Asahiguard, AG710, Surflon S-382, SC-101, SC-102, SC-103, SC-104, SC-105 and SC-106 (products of Asahi Glass Co., Ltd.); an organosiloxane polymer, KP341 (product of Shin-Etsu Chemical Co., Ltd.); and acrylic or methacrylic (co) polymers, Polyflow No. 75 and No. 95 (products of Kyoeisha Chemical Co., Ltd.). The amount of these surfactants to be incorporated is generally at most 2 parts by weight, preferably at most 1 part by weight, per 100 parts by weight of solids of the composition.

(Developer)

An aqueous solution of an alkali is generally used as an alkaline developer for the positive resist composition according to the present invention. Specific examples of the alkali solution include aqueous solutions of inorganic alkalis such as sodium hydroxide, potassium hydroxide, sodium silicate and ammonia; aqueous solutions of primary amines such as ethylamine and propylamine; aqueous solutions of secondary amines such as diethylamine and dipropylamine; aqueous solutions of tertiary amines such as trimethylamine and triethylamine; aqueous solutions of alcohol amines such as diethylethanolamine and triethanolamine; and aqueous solutions of quaternary ammonium hydroxides such as tetramethylammonium hydroxide, tetraethylammonium hydroxide, trimethylhydroxymethylammonium hydroxide, triethylhydroxymethylammonium hydroxide and trimethylhydroxyethylammonium hydroxide. A water-soluble organic solvent such as methanol, ethanol, propanol or ethylene glycol, a surfactant and a dissolution inhibitor for the resin may be further added to the aqueous alkali solution as needed.

A resist solution obtained by dissolving the resist composition according to the present invention in a solvent is applied onto the surface of a substrate such as a silicon wafer by a method known per se in the art and then dried to remove the solvent, whereby a resist film can be formed. As the coating method used at this time, spin coating can be recommended in particular.

Examples of an exposure source used in exposure for forming a pattern on the resist film thus obtained include sources for electron beams such as ultraviolet radiation, far ultraviolet radiation, KrF excimer laser beam, X-rays and electron beam. It is preferable to conduct a heat treatment (post-exposure bake) after the exposure because the sensitivity of the resist film can be more enhanced and stabilized.

EXAMPLES

The present invention will hereinafter be described more specifically by the following Synthesis Examples, Examples and Comparative Examples. Incidentally, all designations of "part" or "parts" and "%" as will be used in the following examples mean part or parts by weight and wt. % unless expressly noted.

In the following Examples and Comparative Examples, the resulting resist compositions were evaluated in accordance with the following methods. All the resist compositions were evaluated on a silicon wafer.

(1) Sensitivity

Sensitivity is a value with an amount of exposure energy, by which a 1:1 line and space pattern at intervals of 0.60 $\mu$m can be formed to designed dimensions, expressed in terms of exposure time (unit: msec). Incidentally, in Examples 22–29 and Comparative Examples 5–8, a value with an amount of exposure energy, by which a 1:1 line and space pattern at intervals of 0.50 $\mu$m can be formed to designed dimensions, expressed in terms of exposure time (unit: msec) was regarded as sensitivity.

(2) Resolution

A critical resolution ($\mu$m) under the above exposure conditions was expressed.

(3) Film Loss after Development

A thickness ratio (%) of an unpatterned portion of a resist film on a silicon wafer after development to the unpatterned portion before the development was expressed.

(4) Pattern Profile

A silicon wafer on which a resist pattern had been formed was cut in a direction perpendicular to the line pattern, and the pattern was observed through an electron microscope from the sectional direction. The result thereof was ranked as "Good" where the side wall of the pattern rose at an angle of at least 80 degrees to the substrate, and reduction in film thickness was not observed, or "Reduction in film" where reduction in film thickness was observed.

(5) Exposure Margin

A line pattern was formed on a resist by means of a mask having 1:1 line and space dimensions of 0.40 $\mu$m with exposure energy varied to measure the pattern dimensions of the resist by means of an electron microscope for length measuring, thereby diagraming a relationship between the exposure energy and the pattern dimensions of the resist. Exposure energy values in pattern dimensions of 0.44 $\mu$m, 0.40 $\mu$m and 0.36 $\mu$m were determined as E1, E2 and E3, respectively. A value defined by the following equation was regarded as exposure margin.

Exposure margin=(E3−E1)×100/E2.

(6) Focus Margin

A line pattern was formed on a resist by means of a mask having 1:1 line and space dimensions of 0.40 $\mu$m with exposure energy and a focus upon exposure by a stepper varied to measure the dimensions of the resist pattern and observe its form. A range of focal changes, in which the dimensional change of the resist pattern was within ±10% of the designed dimensions, the side wall of the pattern rose at an angle of at least 80 degrees, and reduction in film thickness was not observed, was regarded as focus margin.

Synthesis Example 1
Synthesis of Novolak Resin (A-1)

A 2-liter flask equipped with a condenser and a stirrer was charged with 462 g of m-cresol, 308 g of p-cresol, 360 g of 37% formalin and 2.49 g of oxalic acid dehydrate. While holding the contents at 95–100° C., a reaction was conducted for 2 hours. Thereafter, water was distilled off over 2 hours at 100–105° C., and the pressure within the flask was reduced to 10 mmHg while further heating the reaction mixture up to 180° C., thereby removing unreacted monomers and water. The reaction mixture was then cooled down to room temperature to collect a product, thereby obtaining 515 g of Novolak Resin (A-1). The weight average molecular weight (Mw) of this Novolak Resin (A-1) was determined in terms of polystyrene by GPC and found to be 6,000.

Synthesis Example 2
Synthesis of Novolak Resin (A-2)

Added to 380 g of the Novolak Resin (A-1) obtained in Synthesis Example 1 were 360 g of ethyl cellosolve acetate to dissolve the resin therein. A flask was equipped with a dropping funnel, and 950 g of toluene were added dropwise to the flask from the dropping funnel in the state that the temperature of the solution in the flask was controlled to 80–85° C. Thereafter, the resultant mixture was heated at 80° C. for 1 hour. The mixture was slowly cooled down to room temperature and left at rest further for 1 hour. After a supernatant of a resin deposited was removed by decantation, 570 g of ethyl lactate were added. The resultant mixture was heated to 100° C. under 100 mmHg to remove residual toluene, thereby obtaining a solution of Novolak Resin (A-2) in ethyl lactate. The weight average molecular weight (Mw) of this Novolak Resin (A-2) was determined in terms of polystyrene by GPC and found to be 9,800.

Synthesis Example 3
Synthesis of Novolak Resin (A-3)

A 2-liter flask equipped with a condenser and a stirrer was charged with 280 g of m-cresol, 210 g of p-cresol, 265 g of 2,3,5-trimethylphenol, 368 g of 37% formalin and 2.49 g of oxalic acid dihydrate. While holding the contents at 95–100° C., a reaction was conducted for 2 hours. Thereafter, water was distilled off over 2 hours at 100–105° C., and the pressure within the flask was reduced to 10 mmHg while further heating the reaction mixture up to 180° C., thereby removing unreacted monomers and water. The reaction mixture was then cooled down to room temperature to collect a product, thereby obtaining 675 g of Novolak Resin (A-3). The weight average molecular weight (Mw) of this Novolak Resin (A-3) was determined in terms of polystyrene by GPC and found to be 6,400.

Synthesis Example 4
Synthesis of Novolak Resin (A-4)

Added to 380 g of the Novolak Resin (A-3) obtained in Synthesis Example 3 were 3,800 g of toluene to dissolve the resin therein. After the solution was heated at 80° C. for 1 hour, it was slowly cooled down to room temperature and left at rest further for 1 hour. After a supernatant of a resin deposited was removed by decantation, 570 g of ethyl lactate were added. The resultant mixture was heated to 100° C. under 100 mmHg to remove residual toluene, thereby obtaining a solution of Novolak Resin (A-4) in ethyl lactate. The weight average molecular weight (Mw) of this Novolak Resin (A-4) was determined in terms of polystyrene by GPC and found to be 9,800.

Synthesis Example 5
Synthesis of Photosensitive Agent (B-1)

Novolak Resin (A-1) was used as a polyhydroxy compound, while a 10% solution of 1,2-naphthoquinone-diazide-5-sulfonyl chloride obtained by dissolving the chloride in acetone was used as a quinonediazide sulfonic compound. A concentration of 1,2-naphthoquinone-diazide-5-sulfonyl chloride used was a mol% corresponding to an esterification degree of 40%. While controlling the temperature of a solution containing both compounds to 20–25° C., triethylamine in an amount corresponding to 1.2 equivalents of 1,2-naphthoquinone-diazide-5-sulfonyl chloride was added dropwise over 30 minutes. The mixture was held at the reaction temperature further for 2 hours to complete a reaction. After a salt deposited was separated by filtration, the reaction mixture was poured into a 0.2% aqueous solution of oxalic acid in an amount 10 times as much as the reaction mixture. Solids deposited were collected by filtration, washed with ion-exchanged water and dried to obtain Photosensitive Agent (B-1) of the quinonediazide sulfonate type.

Synthesis Example 6
Synthesis of Photosensitive Agent (B-2)

Photosensitive Agent (B-2) of the quinonediazide sulfonate type was obtained in accordance with the same process as in Synthesis Example 5 except that a compound represented by the formula (III) in which $R^{16}$ and $R^{17}$ were H, and $R^{18}$, $R^{19}$, $R^{20}$ and $R^{21}$ were $CH_3$ was used as a polyhydroxy compound, and 1,2-naphthoquinonediazide-5-sulfonyl chloride was used in a mol% corresponding to an esterification degree of 70% as a quinonediazide sulfonic compound.

Synthesis Example 7
Collection of Phenolic Compounds (CX-1 to CX-3)

Xylok Resins "XL-225-2L", "XL-225-3L" and "XL-225-4L" produced by Mitsui Toatsu Chemicals, Inc. were separately subjected to a fractionation process making use of ethyl cellosolve acetate as a good solvent and toluene as a poor solvent. These three Xylok Resins are all phenolic compounds (CX) having a structural unit represented by the formula (I) in which $R^1$ to $R^{11}$ are hydrogen atoms though their molecular weight distributions are different from one another. As a result of the above fractionation process, three kinds of phenolic compounds (CX), in which the weight average molecular weights (Mw) as determined in terms of polystyrene according to a GPC pattern making use of a WV detector at 254 nm were different from one another, were obtained. More specifically, they are Phenolic Compound (CX-1) whose Mw is 750, Phenolic Compound (CX-2) whose Mw is 1,000 and Phenolic Compound (CX-3) whose Mw is 1,500.

Synthesis Example 8
Collection of Phenolic Compounds (CX-4 to CX-6)

Xylok Resins "XL-225-2L" and "XL-225-3L" produced by Mitsui Toatsu Chemicals, Inc. were separately subjected to a fractionation process making use of ethyl cellosolve acetate as a good solvent and toluene as a poor solvent, thereby obtaining three kinds of phenolic compounds (CX), in which the weight average molecular weights (Mw) as determined in terms of polystyrene according to a GPC pattern making use of a UV detector at 254 nm were different from one another. More specifically, they are Phenolic Compound (CX-4) whose Mw is 750, Phenolic Compound (CX-5) whose Mw is 1,020 and Phenolic Compound (CX-6) whose Mw is 6,600.

Synthesis Example 9
Collection of Phenolic Compounds (CD-1 to CD-3)

Dicyclopentadiene phenol resins "DPR-5000", "DPR-3000" and "DPR-5210" produced by Mitsui Toatsu Chemicals, Inc. were separately subjected to a fractionation process making use of ethyl cellosolve acetate as a good solvent and toluene as a poor solvent. The dicyclopentadiene phenol resins "DPR-5000" and "DPR-3000" are both copolymers of dicyclopentadiene and phenol though their molecular weight distributions are different from each other. The dicyclopentadiene phenol resin "DPR-5210" is a copolymer of dicyclopentadiene, formaldehyde and phenol. As a result of the above fractionation process, three kinds of phenolic compounds (CD), in which the weight average molecular weights (Mw) as determined in terms of polystyrene according to a GPC pattern making use of a UV detector at 254 nm were different from one another, were obtained. More specifically, they are Phenolic Compound (CD-1) whose Mw is 750, Phenolic Compound (CD-2) whose Mw is 1,200 and Phenolic Compound (CD-3) whose Mw is 1,800.

Synthesis Example 10
Collection of Phenolic Compounds (CD-4 to CD-6)

Dicyclopentadiene phenol resins "DPR-3000", "DPR-5000" and "DPR-5210" produced by Mitsui Toatsu Chemicals, Inc. were separately subjected to a fractionation process making use of ethyl cellosolve acetate as a good solvent and toluene as a poor solvent in the same manner as in Synthesis Example 9, thereby obtaining three kinds of phenolic compounds (CD), in which the weight average molecular weights (Mw) as determined in terms of polystyrene according to a GPC pattern making use of a UV detector at 254 nm were different from one another. More specifically, they are Phenolic Compound (CD-4) whose Mw is 700, Phenolic Compound (CD-5) whose Mw is 1,500 and Phenolic Compound (CD-6) whose Mw is 5,800.

Example 1

A novolak resin, a photosensitive agent and Phenolic Compound (CX-1) obtained in Synthesis Example 7 were dissolved in 400 parts of ethyl lactate in accordance with its corresponding formulation shown in Table 4, and an amount of the solvent was controlled in such a manner that the resultant solution could be coated to a film thickness of 1.17 $\mu$m. This solution was filtered through a Teflon filter (polytetrafluoroethylene filter) having a pore size of 0.1 $\mu$m to prepare a resist solution.

After coating a silicon wafer with the thus-prepared resist solution by a spin coater, the resist solution was prebaked at 90° C. for 90 seconds, thereby forming a resist film having a thickness of 1.17 $\mu$m. The silicon wafer on which the resist film had been formed was exposed with exposure time varied using an i-ray stepper, "NSR-1755i7A" (manufactured by Nikon Corp., NA=0.50) and a test reticle. The thus-exposed wafer was then subjected to post-exposure baking at 110° C. for 60 seconds, followed by its development by the paddle process at 23° C. for 1 minute in a 2.38% aqueous solution of tetramethylammonium hydroxide to form a positive pattern. The silicon wafer on which the pattern had been formed was taken out of the aqueous solution to observe through an electron microscope, thereby determining its sensitivity, resolution, film loss after development and pattern profile. The results are shown in Table 4.

Examples 2–9 and Comparative Examples 1–2

Resist solutions were prepared in the same manner as in Example 1 except that the formulation in Example 1 was changed to their corresponding formulations shown in Table 4. Respective resist films were formed on silicon wafers from the resist solutions thus prepared to evaluate them. The results are shown in Table 4. Incidentally, in Example 9 and Comparative Examples 1 and 2, Trisphenol-PA (product of Honshu Chemical Industry Co., Ltd.) was used as the additional phenolic compound.

TABLE 4

| | Composition of positive resist | | | | | | | | Evaluation result | | | |
|---|---|---|---|---|---|---|---|---|---|---|---|---|
| | Novolak Resin | | Photosensitive agent | | Phenolic compound | | | Additive | | Sensitivity | Film loss after development | Resolution | Pattern |
| | Code | Parts | Code | Parts | Code | Mw | Parts | Kind | Parts | (msec) | (%) | ($\mu$m) | profile |
| Ex. 1 | A-2 | 80 | B-1 | 30 | CX-1 | 750 | 20 | — | — | 404 | 100 | 0.40 | Good |
| Ex. 2 | A-2 | 70 | B-1 | 30 | CX-2 | 1,000 | 30 | — | — | 390 | 100 | 0.40 | Good |
| Ex. 3 | A-1 | 85 | B-1 | 30 | CX-3 | 1,500 | 15 | — | — | 384 | 100 | 0.35 | Good |
| Ex. 4 | A-4 | 80 | B-1 | 30 | CX-1 | 750 | 20 | — | — | 422 | 100 | 0.35 | Good |
| Ex. 5 | A-4 | 70 | B-1 | 30 | CX-2 | 1,000 | 30 | — | — | 448 | 100 | 0.35 | Good |
| Ex. 6 | A-3 | 70 | B-1 | 30 | CX-3 | 1,500 | 30 | — | — | 416 | 100 | 0.40 | Good |
| Ex. 7 | A-4 | 80 | B-2 | 30 | CX-1 | 750 | 20 | — | — | 430 | 100 | 0.40 | Good |
| Ex. 8 | A-2 | 80 | B-2 | 30 | CX-2 | 1,000 | 20 | — | — | 420 | 100 | 0.40 | Good |
| Ex. 9 | A-4 | 70 | B-1 | 30 | CX-2 | 1,000 | 20 | TP-PA | 10 | 434 | 100 | 0.35 | Good |
| Comp. Ex. 1 | A-2 | 80 | B-1 | 30 | — | — | — | TP-PA | 20 | 454 | 96 | 0.45 | Reduction in film |
| Comp. Ex. 2 | A-2 | 80 | B-2 | 30 | — | — | — | TP-PA | 20 | 468 | 97 | 0.45 | Reduction in film |

(Note)
(1) TP-PA: Trisphenol PA

From these results, it was found that when the phenolic compound (CX) is added, all the sensitivity, film loss after development, resolution and pattern profile of the resulting resist composition are improved. It was also found that when the additional phenolic compound is used in combination, the effect of the phenolic compound (CX) is further enhanced.

Example 10

A novolak resin, a photosensitive agent and Phenolic Compound (CD-1) obtained in Synthesis Example 9 were dissolved in 400 parts of ethyl lactate in accordance with its corresponding formulation shown in Table 5, and an amount of the solvent was controlled in such a manner that the resultant solution could be coated to a film thickness of 1.17 μm. This solution was filtered through a Teflon filter (polytetrafluoroethylene filter) having a pore size of 0.1 μm to prepare a resist solution.

After coating a silicon wafer with the thus-prepared resist solution by a spin coater, the resist solution was prebaked at 90° C. for 90 seconds, thereby forming a resist film having a thickness of 1.17 μm. The silicon wafer on which the resist film had been formed was exposed with exposure time varied using an i-ray stepper, "NSR-1755i7A" (manufactured by Nikon Corp., NA=0.50) and a test reticle. The thus-exposed wafer was then subjected to post-exposure baking at 110° C. for 60 seconds, followed by its development by the paddle process at 23° C. for 1 minute in a 2.38% aqueous solution of tetramethylammonium hydroxide to form a positive pattern. The silicon wafer on which the pattern had been formed was taken out of the aqueous solution to observe through an electron microscope, thereby determining its sensitivity, resolution, film loss after development and pattern profile. The results are shown in Table 5.

Examples 11–21 and Comparative Examples 3–4

Resist solutions were prepared in the same manner as in Example 10 except that the formulation in Example 10 was changed to their corresponding formulations shown in Table 5. Respective resist films were formed on silicon wafers from the resist solutions thus prepared to evaluate them. The results are shown in Table 5. Incidentally, in Examples 16–21 and Comparative Examples 3 and 4, Trisphenol PA (product of Honshu Chemical Industry Co., Ltd.) or 1,1-bis (3,5-dimethyl-4-hydroxyphenyl)-1-(2-hydroxyphenyl) methane was used as the additional phenolic compound.

Example 22

A novolak resin, a photosensitive agent, Phenolic Compound (CX-4) and Phenolic Compound (CD-5) were dissolved in 400 parts of ethyl lactate in accordance with a formulation for Resist Solution R1 shown in Table 6, and an amount of the solvent was controlled in such a manner that the resultant solution could be coated to a film thickness of 1.07 μm. This solution was filtered through a Teflon filter (polytetrafluoroethylene filter) having a pore size of 0.1 Mm to prepare Resist Solution R1.

After coating a silicon wafer with the thus-prepared resist solution by a spin coater, the resist solution was prebaked at 90° C. for 90 seconds, thereby forming a resist film having a thickness of 1.07 μm. The silicon wafer on which the resist film had been formed was exposed with exposure time varied using an i-ray stepper, "NSR-1755i7A" (manufactured by Nikon Corp., NA=0.50) and a test reticle. The thus-exposed wafer was then subjected to post-exposure baking at 110° C. for 60 seconds, followed by its development by the paddle process at 23° C. for 1 minute in a 2.38% aqueous solution of tetramethylammonium hydroxide to form a positive pattern. The silicon wafer on which the pattern had been formed was taken out of the aqueous solution to observe through an electron microscope, thereby determining its sensitivity, resolution, film loss after development, pattern profile, exposure margin and focus margin. The results are shown in Table 7.

Examples 23–28, 30–31 and Comparative Examples 5–6

Resist Solutions (R2 to R11) were prepared in accordance with their corresponding formulations shown in Table 6 to form respective resist films on silicon wafers in the same

TABLE 5

| | Composition of positive resist | | | | | | | | Evaluation result | | | |
|---|---|---|---|---|---|---|---|---|---|---|---|---|
| | Novolak Resin | | Photosensitive agent | | Phenolic compound | | | Additive | | Sensitivity | Film loss after development | Resolution | Pattern |
| | Code | Parts | Code | Parts | Code | Mw | Parts | Kind | Parts | (msec) | (%) | (μm) | profile |
| Ex. 10 | A-2 | 80 | B-1 | 30 | CD-1 | 750 | 20 | — | — | 424 | 100 | 0.35 | Good |
| Ex. 11 | A-4 | 80 | B-2 | 30 | CD-1 | 750 | 20 | — | — | 438 | 100 | 0.35 | Good |
| Ex. 12 | A-2 | 70 | B-1 | 30 | CD-2 | 1,200 | 30 | — | — | 418 | 100 | 0.35 | Good |
| Ex. 13 | A-4 | 70 | B-2 | 30 | CD-2 | 1,200 | 30 | — | — | 426 | 100 | 0.35 | Good |
| Ex. 14 | A-2 | 60 | B-2 | 30 | CD-3 | 1,800 | 40 | — | — | 422 | 100 | 0.35 | Good |
| Ex. 15 | A-4 | 60 | B-2 | 30 | CD-3 | 1,800 | 40 | — | — | 440 | 100 | 0.35 | Good |
| Ex. 16 | A-2 | 80 | B-1 | 30 | CD-1 | 750 | 10 | TP-PA | 10 | 410 | 100 | 0.35 | Good |
| Ex. 17 | A-4 | 80 | B-2 | 30 | CD-1 | 750 | 10 | TP-PA | 10 | 426 | 100 | 0.35 | Good |
| Ex. 18 | A-2 | 80 | B-1 | 30 | CD-1 | 750 | 10 | DMHM | 10 | 418 | 100 | 0.35 | Good |
| Ex. 19 | A-4 | 80 | B-2 | 30 | CD-1 | 750 | 10 | DMHM | 10 | 430 | 100 | 0.35 | Good |
| Ex. 20 | A-2 | 70 | B-1 | 30 | CD-2 | 1,200 | 20 | TP-PA | 10 | 406 | 100 | 0.35 | Good |
| Ex. 21 | A-2 | 70 | B-2 | 30 | CD-2 | 1,200 | 20 | TP-PA | 10 | 418 | 100 | 0.35 | Good |
| Comp. Ex. 3 | A-2 | 80 | B-1 | 30 | — | — | — | TP-PA | 20 | 460 | 96 | 0.43 | Reduction in film |
| Comp. Ex. 4 | A-4 | 80 | B-2 | 30 | — | — | — | TP-PA | 20 | 478 | 98 | 0.43 | Reduction in film |

(Note)
(1) TP-PA: Trisphenol PA
(2) DHPM: 1,1-Bis(3,5-dimethyl-4-hydroxyphenyl)-1-(2-hydroxyphenyl)methane From these results, it was found that when the phenolic compound (CD) having the structural unit represented by the formula (II) is used as the phenolic compound, the sensitivity, film loss after development, resolution and pattern profile of the resulting resist composition are improved.

manner as in Example 22, thereby evaluating them. The results are shown in Table 7.

Example 29

A positive resist, ZIR-9100 (product of Nippon Zeon Co., Ltd.) was coated on a silicon wafer in such a manner that a film thickness was 0.52 μm after baking under the following conditions. With respect to the baking conditions, the prebaking was conducted at 90° C. for 90 seconds using a hot plate, while the post-exposure baking was performed at 300° C. for 2 minutes. The refractive index of this silicon wafer on which the resist film had been formed was measured by means of a spectral ellipsometer to determine a reflectance of i-ray exposure light. As a result, the reflectance was found to be 1.7%.

Resist Solution R3 shown in Table 6 was coated on the silicon wafer (low-reflective substrate), on which the resist film had been formed, under such conditions that a film thickness was 1.06 μm, and the resist film thus formed was evaluated. The conditions for the coating and evaluation of the resist were the same as those used in Example 22.

Comparative Example 7

The evaluation was performed in the same manner as in Example 29 except that R9 was used as the resist solution in place of R3.

The formulations of the resist solutions according to Examples 22–31 and Comparative Examples 5–7, and the evaluation results thereof are shown in Table 6 and Table 7, respectively.

sensitivity, film loss after development, resolution, pattern profile, exposure margin and focus margin of the resulting resist composition are improved. It was also found that such a resist composition can achieve excellent sensitivity, exposure margin and focus margin, in particular, on a low-reflective substrate (Example 29).

Industrial Applicability

Since the positive resist compositions according to the present invention are excellent in sensitivity, film loss after development, resolution, pattern profile, exposure margin and focus margin, they are useful as positive resists for minute processing to 1 μm or smaller in line width.

We claim:

1. A positive resist composition comprising in combination (A) an alkali-soluble phenol resin, (B) a quinonediazide sulfonate photosensitive agent and (C) a phenolic compound, wherein the phenolic compound (C) is at least one phenolic compound selected from the group consisting of phenolic compounds (CX) having a structural unit represented by the following formula (I) and a weight average molecular weight of at least 750 and phenolic compounds (CD) having a structural unit represented by the following

TABLE 6

| Resist solution | Novolak Resin | | Photosensitive agent | | Phenolic compound CX | | | Phenolic compound CD | | | Additive | |
|---|---|---|---|---|---|---|---|---|---|---|---|---|
| | Code | Parts | Code | Parts | Code | Mw | Parts | Code | Mw | Parts | Kind | Parts |
| R1 | A-2 | 70 | B-2 | 30 | CX-4 | 750 | 20 | CD-5 | 1,500 | 10 | — | — |
| R2 | A-2 | 70 | B-2 | 30 | CX-5 | 1,020 | 15 | CD-4 | 700 | 15 | — | — |
| R3 | A-4 | 30 | B-2 | 30 | CX-4 | 750 | 20 | CD-4 | 700 | 10 | — | — |
| R4 | A-2 | 30 | B-2 | 30 | CX-6 | 6,600 | 50 | CD-4 | 700 | 20 | — | — |
| R5 | A-2 | 30 | B-2 | 30 | CX-4 | 750 | 20 | CD-6 | 5,800 | 50 | — | — |
| R6 | A-2 | 65 | B-2 | 30 | CX-5 | 1,020 | 15 | CD-4 | 700 | 10 | TP-PA | 10 |
| R7 | A-4 | 60 | B-2 | 30 | CX-4 | 750 | 20 | CD-5 | 1,500 | 10 | TP-PA | 10 |
| R8 | A-1 | 100 | B-2 | 30 | — | — | — | — | — | — | — | — |
| R9 | A-2 | 100 | B-2 | 30 | — | — | — | — | — | — | TP-PA | 10 |
| R10 | A-2 | 100 | B-2 | 30 | CX-4 | 750 | 30 | — | — | — | — | — |
| R11 | A-4 | 100 | B-1 | 30 | CX-4 | 750 | 30 | CD-5 | 1,500 | 20 | Pyrogallol | 5 |

(Note) (1) TP-PA: Trisphenol PA.

TABLE 7

| | Resist solution | Sensitivity (msec) | Resolution (μm) | Film loss after development (%) | Pattern profile | Exposure margin (%) | Focus margin (%) |
|---|---|---|---|---|---|---|---|
| Ex. 22 | R1 | 420 | 0.34 | 100 | Good | 18 | 1.2 |
| Ex. 23 | R2 | 460 | 0.36 | 100 | Good | 19 | 1.1 |
| Ex. 24 | R3 | 380 | 0.34 | 100 | Good | 22 | 1.3 |
| Ex. 25 | R4 | 520 | 0.34 | 100 | Good | 20 | 1.1 |
| Ex. 26 | R5 | 480 | 0.34 | 100 | Good | 23 | 1.1 |
| Ex. 27 | R6 | 360 | 0.36 | 100 | Good | 20 | 1.2 |
| Ex. 28 | R7 | 340 | 0.36 | 100 | Good | 19 | 1.2 |
| Ex. 29 | R3 | 500 | 0.34 | 100 | Good | 26 | 1.3 |
| Ex. 30 | R10 | 440 | 0.36 | 100 | Good | 11 | 0.9 |
| Ex. 31 | R11 | 430 | 0.34 | 100 | Good | 24 | 1.3 |
| Comp. Ex. 5 | R8 | 420 | 0.44 | 98 | Reduction in film | 8 | 0.6 |
| Comp. Ex. 6 | R9 | 420 | 0.44 | 99 | Reduction in film | 10 | 0.8 |
| Comp. Ex. 7 | R9 | 520 | 0.40 | 99 | Reduction in film | 10 | 0.5 |

From these results, it was found that when the phenolic compound (CX) having the structural unit represented by the formula (I) and the phenolic compound (CD) having the structural unit represented by the formula (II) are used, the formula (II):

wherein $R^1$ to $R^3$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, $R^4$ to $R^{11}$ are, independently of one another, a hydrogen atom, an alkyl group which may be substituted, a cycloalkyl group which may be substituted, an alkenyl group which may be substituted, an aryl group which may be substituted, or an alkoxy group which may be substituted, and n is a positive integer; and wherein $R^{12}$ to $R^{15}$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, with the proviso that at least one of $R^{12}$ to $R^{15}$ is a hydroxy group, and m is a positive integer.

2. The positive resist composition according to claim 1, wherein said at least one phenolic compound (C) selected from the group consisting of the phenolic compounds (CX) and the phenolic compounds (CD) is a low-molecular weight phenolic compound having a weight average molecular weight lower than 2,000 as determined in terms of polystyrene according to a GPC making use of a UV detector at 254 nm.

3. The positive resist composition according to claim 2, wherein the composition comprises 1–100 parts by weight of (B) the quinonediazide sulfonate photosensitive agent and 3–100 parts by weight of (C) the low-molecular weight phenolic compound per 100 parts by weight of (A) the alkali-soluble phenol resin.

4. The positive resist composition according to claim 1, wherein a weight ratio of the high-molecular weight phenolic compound (C) to the alkali-soluble phenol resin (A) is within a range of 0.1–10.

5. The positive resist composition according to claim 1, wherein the composition comprises 1–100 parts by weight of (B) the quinonediazide sulfonate photosensitive agent per 100 parts by weight of (A) the alkali-soluble phenol resin.

6. The positive resist composition according to claim 1, wherein the composition comprises, as the phenolic compound (C), a high-molecular weight phenolic compound having a weight average molecular weight of 2,000–25,000 and a low-molecular weight phenolic compound having a weight average molecular weight lower than 2,000, both, as determined in terms of polystyrene according to a GPC making use of a UV detector at 254 nm.

7. The positive resist composition according to claim 6, wherein the high-molecular weight phenolic compound is a phenolic compound (CX), and the low-molecular weight phenolic compound is a phenolic compound (CD).

8. The positive resist composition according to claim 6, wherein the high-molecular weight phenolic compound is a phenolic compound (CD), and the low-molecular weight phenolic compound is a phenolic compound (CX).

9. The positive resist composition according to claim 1, wherein the composition further comprises, as the phenolic compound (C), an additional phenolic compound (E) in addition to said at least one phenolic compound selected from the group consisting of the phenolic compounds (CX) and the phenolic compounds (CD).

10. The positive resist composition according to claim 9, wherein the additional phenolic compound (E) is a trisphenol, tetrakisphenol or pyrogallol.

11. The positive resist composition according to claim 9 or 10, wherein a weight ratio of the additional phenolic compound (E) to the low-molecular weight phenolic compound, which is at least one phenolic compound selected from the group consisting of the phenolic compounds (CX) and the phenolic compounds (CD) and has a weight average molecular weight lower than 2,000 as determined in terms of polystyrene according to a GPC making use of a UV detector at 254 nm, is 0.1–5.

12. A positive resist composition comprising in combination (A) an alkali-soluble phenol resin, (B) a quinonediazide sulfonate photosensitive agent and (C) a phenolic compound, wherein the phenolic compound (C) is at least one phenolic compound selected from the group consisting of phenolic compounds (CX) having a structural unit represented by the following formula (I) and phenolic compounds (CD) having a structural unit represented by the following formula (II):

wherein $R^1$ to $R^3$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, $R^4$ to $R^{11}$ are, independently of one another, a hydrogen atom, an alkyl group, a cycloalkyl group, an alkenyl group, an unsubstituted aryl group, or an alkoxy group, and n is a positive integer; and wherein $R^{12}$ to $R^{15}$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, with the proviso that at least one of $R^{12}$ to $R^{15}$ is a hydroxy group, and m is a positive integer.

13. A positive resist composition comprising in combination (A) an alkali-soluble phenol resin, (B) a quinonediazide sulfonate photosensitive agent and (C) a phenolic compound, wherein the phenolic compound (C) comprises at least one high molecular weight phenolic compound having a weight average molecular weight of 2,000–25,000 as determined in terms of polystyrene according to a GPC making use of a UV detector at 254 nm, and selected from the group consisting of phenolic compounds (CX) having a structural unit represented by the following formula (I) and phenolic compounds (CD) having a structural unit represented by the following formula (II):

wherein $R^1$ to $R^3$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, $R^4$ to $R^{11}$ are, independently of one another, a hydrogen atom, an alkyl group which may be substituted, a cycloalkyl group which may be substituted, an alkenyl group which may be substituted, an aryl group which may be substituted, or an alkoxy group which may be substituted, and n is a positive integer; and wherein $R^{12}$ to $R^{15}$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, with the proviso that at least one of $R^{12}$ to $R^{15}$ is a hydroxy group, and m is a positive integer.

14. The positive resist composition according to claim 13, wherein the composition comprises, as the phenolic compound (C), the high-molecular weight phenolic compound having a weight average molecular weight of 2,000–25,000 and a low-molecular weight phenolic compound having a weight average molecular weight lower than 2,000, both, as determined in terms of polystyrene according to a GPC making use of a UV detector at 254 nm.

15. The positive resist composition according to claim 14, wherein the high-molecular weight phenolic compound is a phenolic compound (CX), and the low-molecular weight phenolic compound is a phenolic compound of formula (II).

16. The positive resist composition according to claim 14, wherein the high-molecular weight phenolic compound is a phenolic compound (CD), and the low-molecular weight phenolic compound is a phenolic compound of formula (I).

* * * * *

UNITED STATES PATENT AND TRADEMARK OFFICE
CERTIFICATE OF CORRECTION

PATENT NO. : 6,013,407
DATED : January 11, 2000
INVENTOR(S) : Kawata et al.

It is certified that error appears in the above-identified patent and that said Letters Patent is hereby corrected as shown below:

The title page should be deleted to appear as per attached title page.

Please delete sheets 1-24 and substitute sheets 1-26 as per attached.

Signed and Sealed this

Second Day of April, 2002

*Attest:*

*Attesting Officer*

JAMES E. ROGAN
*Director of the United States Patent and Trademark Office*

(12) United States Patent
Kawata et al.

(10) Patent No.: US 6,013,407 B1
(45) Date of Patent: Jan. 11, 2000

(54) POSITIVE RESIST COMPOSITION

(76) Inventors: Shoji Kawata; Hiroshi Hayashi; Hirokazu Higashi; Takeyoshi Kato; Masahiro Nakamura, all of Kanagawa (JP)

(*) Notice: Subject to any disclaimer, the term of this patent is extended or adjusted under 35 U.S.C. 154(b) by 0 days.

(21) Appl. No.: 08/875,045

(22) PCT Filed: Jan. 17, 1996

(86) PCT No.: PCT/JP96/00061

§ 371 Date: Jul. 8, 1997

§ 102(e) Date: Jul. 8, 1997

(87) PCT Pub. No.: WO96/22563

PCT Pub. Date: Jul. 25, 1996

(30) Foreign Application Priority Data

Jan. 17, 1995 (JP) .............................. 7-022273
Feb. 20, 1995 (JP) .............................. 7-055032
Apr. 26, 1995 (JP) .............................. 7-125985

(51) Int. Cl.⁶ .............................. G03F 7/023

(52) U.S. Cl. .............................. 430/191; 430/165; 430/192; 430/193

(58) Field of Search .............................. 430/191, 192, 430/193, 165

(56) References Cited

U.S. PATENT DOCUMENTS

| | | | |
|---|---|---|---|
| 5,112,712 A | 5/1992 | Yamada et al. | 430/191 |
| 5,238,775 A * | 8/1993 | Kajita et al. | 430/191 |
| 5,275,910 A | 1/1994 | Moriuma et al. | 430/191 |
| 5,340,686 A | 8/1994 | Sakaguchi et al. | 430/191 |
| 5,407,779 A | 4/1995 | Uetani et al. | 430/192 |
| 5,424,167 A * | 6/1995 | Uetani et al. | 430/192 |
| 5,451,484 A * | 9/1995 | Nagase et al. | 430/192 |
| 5,541,033 A * | 7/1996 | Blakeney et al. | 430/192 |

FOREIGN PATENT DOCUMENTS

| | | |
|---|---|---|
| EP | 0249139 | 12/1987 |
| EP | 0541112 | 5/1993 |
| EP | 0598320 | 5/1994 |
| EP | 0689097 | 12/1995 |
| JP | 84-46917 | 11/1984 |
| JP | 3-200252 | 9/1991 |
| JP | 4-122938 | 4/1992 |
| JP | 5-127374 | 5/1993 |
| JP | 5-204149 | 8/1993 |
| JP | 5-232697 | 9/1993 |
| JP | 6-116370 | 4/1994 |
| JP | 6-167805 | 6/1994 |
| JP | 6-289607 | 10/1994 |
| JP | 7-72622 | 3/1995 |
| JP | 7-271022 | 10/1995 |
| JP | 7-306532 | 11/1995 |
| JP | 7-333843 | 12/1995 |

OTHER PUBLICATIONS

Patent Abstract of Japan based on Publication No. 5–323602 dated Dec. 7, 1993.
Patent Abstract of Japan based on Publication No. 6–266107 dated Sep. 22, 1994.
Patent Abstract of Japan based on Publication No. 8–179502 dated Jul. 12, 1996.
Communication from the EPO containing Supplementary European Search Report for Appln. No. EP 96 90 0700 dated Jul. 5, 1999.

* cited by examiner

Primary Examiner—John S. Chu

(57) ABSTRACT

A positive resist composition is excellent in sensitivity, film loss after development, resolution, thermal-flow resistance, storage stability, exposure margin and focus margin and comprises in combination (A) an alkali-soluble phenol resin, (B) a quinonediazide sulfonate type photosensitive agent and (C) a phenolic compound, wherein the phenolic compound (C) is at least one phenolic compound selected from the group consisting of phenolic compounds (CX) having a structural unit represented by the following formula (I) and phenolic compounds (CD) having a structural unit represented by the following formula (II):

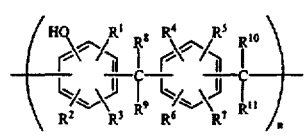

(I)

wherein $R^1$ to $R^3$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, $R^4$ to $R^{11}$ are, independently of one another, a hydrogen atom, an alkyl group which may be substituted, a cycloalkyl group which may be substituted, an alkenyl group which may be substituted, an aryl group which may be substituted, or an alkoxy group which may be substituted, and n is a positive integer; and

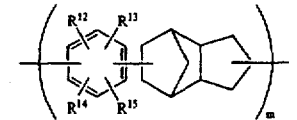

(II)

wherein $R^{12}$ to $R^{15}$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, with the proviso that at least one of $R^{12}$ to $R^{15}$ is a hydroxyl group, and m is a positive integer.

16 Claims, No Drawings

POSITIVE RESIST COMPOSITION

DESCRIPTION

1. Technical Field

The present invention relates to a positive resist composition, and more particularly to a positive resist composition suitable for use in minute processing required for the fabrication of semiconductor devices, magnetic bubble memory devices, integrated circuits and the like.

2. Background Art

In recent years, positive resist compositions have been mainly used as resist compositions for forming semiconductor devices. The reason for it is that a negative resist composition generally has high sensitivity, but involves a drawback in resolution because it is developed with an organic solvent, so that it swells to a significant extent. On the other hand, positive resist compositions are believed that they can be satisfactorily accommodated to the integration of semiconductors to a high degree because they are generally excellent in resolution. The positive resist compositions heretofore commonly used in this field are those composed of an alkali-soluble phenol resin such as a novolak resin, and a quinonediazide sulfonic acid type photosensitive agent. These positive resist compositions can be developed with an aqueous solution of an alkali and so undergo no swelling and have excellent resolution. In recent years, the resolution of such a positive resist composition has been more enhanced by improvement in its own performance and the development of a higher-performance aligner, so that formation of a minute pattern having a line width of 1 µm or smaller has come to be feasible.

With respect to various properties such as sensitivity, film loss after development, resolution, thermal-flow resistance and storage stability, however, satisfactory results are not necessarily obtained from the conventional positive resist compositions. It is thus desired that the performance of the positive resist compositions be further enhanced. In the formation of, in particular, a minute pattern having a line width of 0.8 µm or smaller, preferably 0.5 µm or smaller, it is necessary to more strictly control resist dimensions. There is accordingly a strong demand for development of a positive resist composition capable of achieving higher dimensional accuracy. There is also a demand for development of a positive resist composition which undergoes little dimensional changes by variations of exposure and focal deviation of exposure light, namely, is good in the so-called exposure margin or focus margin.

From such a point of view, it has been proposed to use, as an additive for modifying resist properties, various kinds of phenolic compounds for positive resist compositions comprising an alkali-soluble phenol resin and a quinonediazide sulfonate type photosensitive agent (Japanese Patent Application Laid-Open Nos. 200252/1991, 122938/1992, 127374/1993 and 232697/1993). However, the positive resist compositions specifically disclosed in these documents are somewhat insufficient in resist properties such as sensitivity, resolution and film loss after development. There is thus a demand for development of a further improved positive resist composition. The improvement of these various properties is extremely important in processing of, in particular, gates, holes, wiring layers and the like, which are difficult to control dimensions because of high reflectance of substrates.

In order to prevent the reduction of accuracy in dimensional control by reflection of exposure light from a substrate, there has also been proposed a methods of reducing the reflectance of a substrate by forming a film on the substrate with an inorganic substance by a CVD process or a PVP process or by coating the substrate with a film of a resin to which a suitable light absorbing component has been added. However, it has not been yet successful to achieve sufficient resist properties on such a substrate by the conventional positive resist compositions. There is therefore a demand for development of a positive resist composition capable of achieving satisfactory resist properties even on such a reflectance-reduced substrate.

DISCLOSURE OF THE INVENTION

It is an object of the present invention to provide a positive resist composition which is excellent in various properties such as sensitivity, film loss after development, resolution, thermal-flow resistance and storage stability.

Another object of the present invention is to provide a positive resist composition which is excellent in the above-described various resist properties and improved in exposure margin and focus margin.

A further object of the present invention is to provide a positive resist composition which can exhibit the excellent resist properties even when it is applied to a substrate the reflectance of which has been reduced.

The present inventors have carried out an extensive investigation with a view toward overcoming the above-described problems. As a result, it has been found that the above objects can be achieved by using a certain specific phenolic compound, thus leading to completion of the present invention.

According to the present invention, there is thus provided a positive resist composition comprising in combination (A) an alkali-soluble phenol resin, (B) a quinonediazide sulfonate type photosensitive agent and (C) a phenolic compound, wherein the phenolic compound (C) is at least one phenolic compound selected from the group consisting of phenolic compounds (CX) having a structural unit represented by the following formula (I) and phenolic compounds (CD) having a structural unit represented by the following formula (II):

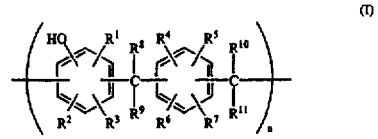
(I)

wherein $R^1$ to $R^3$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, $R^4$ to $R^{11}$ are, independently of one another, a hydrogen atom, an alkyl group which may be substituted, a cycloalkyl group which may be substituted, an alkenyl group which may be substituted, an aryl group which may be substituted, or an alkoxy group which may be substituted, and n is a positive integer; and

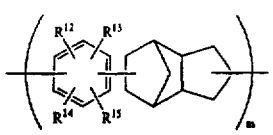
(II)

wherein $R^{12}$ to $R^{15}$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, with the proviso that at least one of $R^{12}$ to $R^{15}$ is a hydroxyl group, and m is a positive integer.

BEST MODE FOR CARRYING OUT THE INVENTION

The present invention will hereinafter be described in detail.

(A) Alkali-Soluble Phenol Resin:

In the present invention, a single alkali-soluble phenol resin may be used, or two or more alkali-soluble phenol resins may be used in combination.

Examples of the alkali-soluble phenol resins include condensation products of a phenol and an aldehyde, condensation products of a phenol and a ketone, vinylphenol polymers, isopropenylphenol polymers, and hydrogenation products of these phenol resins. These phenol resins may be used in combination. Of these, novolak resins obtained by a condensation reaction of a phenol with an aldehyde are particularly preferred.

Specific examples of the phenol used herein include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-methylresorcinol, 4-methylresorcinol, 5-methylresorcinol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, thymol and isothymol. Of these, o-cresol, m-cresol, p-cresol, 2,3-dimethylphenol, 2,5-dimethylphenol, 3,4-dimethylphenol, 3,5-dimethylphenol, 2,3,5-trimethylphenol and 3,4,5-trimethylphenol are preferred. These compounds may be used singly, but two or more thereof may also be used in combination. In particular, combinations of m-cresol, p-cresol and 3,5-dimethylphenol and of m-cresol, p-cresol and 2,3,5-trimethylphenol are preferred.

Specific examples of the aldehyde include formalin, paraformaldehyde, trioxane, acetaldehyde, propyl aldehyde, benzaldehyde, phenylacetaldehyde, α-phenylpropyl aldehyde, β-phenylpropyl aldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbanzaldehyde, p-n-butylbenzaldehyde and terephthalaldehyde. Of these, formalin, paraformaldehyde, acetaldehyde and benzaldehyde are preferred. These compounds may be used either singly or in any combination thereof.

Specific examples of the ketone include acetone, acetophenone, o-hydroxyacetophenone, m-hydroxyacetophenone, p-hydroxyacetophenone, 2,4-dihydroxyacetophenone, methyl ethyl ketone, diethyl ketone and diphenyl ketone. These compounds may be used either singly or in any combination thereof.

These condensation products can be obtained in accordance with a method known per se in the art, for example, by reacting a phenol and an aldehyde or a ketone in the presence of an acid catalyst.

The vinylphenol polymer is selected from among a homopolymer of vinylphenol, and copolymers of vinylphenol and a component copolymerizable therewith. The isopropenylphenol polymer is selected from among a homopolymer of isopropenylphenol, and copolymers of isopropenylphenol and a component copolymerizable therewith. Specific examples of the component copolymerizable with vinylphenol or isopropenylphenol include acrylic acid, methacrylic acid, styrene, maleic anhydride, maleinimide, vinyl acetate, acrylonitrile and derivatives thereof. The copolymers can be obtained in accordance with any of well known methods.

The hydrogenated products of the phenol resins can be obtained in accordance with a method known per se in the art, for example, by dissolving any of the above-described phenol resins in an organic solvent and subjecting the solution to hydrogenation in the presence of a homogeneous or heterogeneous catalyst.

The weight average molecular weight (hereinafter referred to as "average molecular weight" merely) of the alkali-soluble phenol resin useful in the practice of the present invention varies according to the kind of the resin and the preparation process thereof, but is generally 2,000–25,000, preferably 3,500–20,000 as determined in terms of polystyrene according to a GPC pattern making use of a UV detector at 254 nm. If the average molecular weight of the phenol resin is lower than 3,500, the resulting resist composition tends to deteriorate its pattern profile, resolution and developability. Any phenol resin having an average molecular weight lower than 2,000 is not practical. If the average molecular weight exceeds 20,000, the pattern profile, developability and sensitivity of the resulting resist composition are deteriorated. In particular, any phenol resin having an average molecular weight exceeding 25,000 is not practical.

These alkali-soluble phenol resins may also be used after its molecular weight and molecular weight distribution are controlled by a known means. Methods of controlling the molecular weight and molecular weight distribution include a method in which the resin is ground and subjected to solid-liquid extraction with an organic solvent having a suitable solubility, and a method in which the resin is dissolved in a good solvent, and the solution is added dropwise to a poor solvent, or the poor solvent is added dropwise to the solution, thereby conducting solid-liquid extraction or liquid-liquid extraction.

(B) Quinonediazide Sulfonate Type Photosensitive Agent:

The photosensitive agent useful in the practice of the present invention is the quinonediazide sulfonate of a polyhydroxy compound. This ester may not be a compound obtained by esterifying all the hydroxyl groups in a molecule of the polyhydroxy compound, but may be a partially esterified product thereof.

Specific examples of the esterified product used as the photosensitive agent include the 1,2-benzoquinonediazide- 4-sulfonates, 1,2-naphthoquinonediazide-4-sulfonates, 1,2-naphthoquinonediazide-5-sulfonates, 1,2-naphthoquinonediazide-6-sulfonates, 2,1-naphthoquinonediazide-4-sulfonates, 2,1-naphthoquinonediazide-5-sulfonates and 2,1-naphthoquinonediazide-6-sulfonates of polyhydroxy compounds.

The quinonediazide sulfonates of the polyhydroxy compounds can be obtained by converting a quinonediazide sulfonic compound into a quinonediazide sulfonyl halide in accordance with a method known per se in the art and reacting the thus-obtained quinonediazide sulfonyl halide with a polyhydroxy compound in the presence of an inorganic base such as sodium carbonate, sodium hydrogencarbonate, sodium hydroxide or potassium hydroxide, or an organic base such as trimethylamine, triethylamine, tripropylamine, diisopropylamine, tributylamine, pyrrolidine, piperidine, piperadine pyridine, morpholine, pyridine or dicyclohexylamine in a solvent such as acetone, dioxane or tetrahydrofuran.

As the hydroxy compound used herein, any known compound having phenolic hydroxyl groups may be used. Specific examples thereof include polyhydroxybenzophenones such as 2,3,4-trihydroxybenzophenone, 2,4,4'-trihydroxybenzophenone, 2,3,4,4'-tetrahydroxybenzophenone, 2,4,2',4'-tetrahydroxybenzophenone and 2,3,4,2',4'-pentahydrdxybenzophenone; gallic acid esters such as methyl gallate, ethyl gallate and propyl gallate; polyhydroxybisphenylalkanes such as 2,2-bis(4-hydroxyphenyl)propane and 2,2-bis(2,4-dihydroxyphenyl)propane; polyhydroxytrisphenylalkanes such as tris(4-hydroxyphenyl)methane, 1,1,1-tris(4-hydroxy-3-methylphenyl)ethane, 1,1,1-tris(4-hydroxy-3-ethylphenyl)ethane, 1,1,1-tris(4-hydroxyphenyl)ethane, 1,1-bis(4-hydroxy-3-methylphenyl)-1-(4-hydroxyphenyl)ethane and bis(4-hydroxy-3-methylphenyl)-2-hydroxy-4-methoxyphenylmethane; polyhydroxytetrakisphenylalkanes such as 1,1,2,2-tetrakis(4-hydroxyphenyl)ethane, 1,1,2,2-tetrakis(3-methyl-4-hydroxyphenyl)ethane and 1,1,3,3-tetrakis(4-hydroxyphenyl)propane; polyhydroxytetrakisphenylxylenes such as $\alpha,\alpha,\alpha',\alpha'$-tetrakis(4-hydroxyphenyl)-3-xylene, $\alpha,\alpha,\alpha',\alpha'$-tetrakis(4-hydroxyphenyl)-4-xylene and $\alpha,\alpha,\alpha',\alpha'$-tetrakis(3-methyl-4-hydroxyphenyl)-3-xylene; and trimers of phenols such as 2,6-bis(2,4-dihydroxybenzyl)-p-cresol, 2,6-bis(2,4-dihydroxy-3-methylbenzyl)-p-cresol, 4,6-bis(4-hydroxybenzyl)resorcin, 4,6-bis(4-hydroxy-3-methylbenzyl)resorcin, 4,6-bis(4-hydroxybenzyl)-2-methylresorcin and 4,6-bis(4-hydroxy-3-methylbenzyl)-2-methylresorcin with formalin, trimers of phenols represented by the following formula (III) with formalin, and novolak resins.

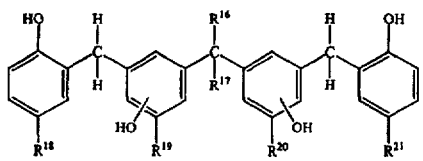

(III)

wherein $R^{16}$ and $R^{17}$ are, independently of each other, a hydrogen atom or an alkyl group having 1–4 carbon atoms, and $R^{18}$ to $R^{21}$ are, independently of one another, an alkyl group having 1–4 carbon atoms.

In the photosensitive agent useful in the practice of the present invention, no particular limitation is imposed on the esterification degree (average esterification degree) of the quinonediazide sulfonic compound to the polyhydroxy compound. However, its lower limit is generally 20%, preferably 30%, and its upper limit is generally 100%, preferably 95%, both, as expressed in terms of mol % of the quinonediazide sulfonic compound to the hydroxyl groups of the polyhydroxy compound. The esterification degree is generally 20–100%, preferably 30–95%. Any esterification degree too low may possibly invite the deterioration in pattern profile and resolution. On the other hand, any esterification degrees too high may possibly invite the lowering of sensitivity.

The quinonediazide sulfonate type photosensitive agents may be used either singly or in any combination thereof. The proportion of the photosensitive agent to be incorporated is generally 1–100 parts by weight, preferably 3–40 parts by weight per 100 parts by weight of the alkali-soluble phenol resin (A). Any proportion lower than 1 part by weight results in a positive resist composition which is difficult to form any resist pattern. On the other hand, any proportion exceeding 100 parts by weight results in a positive resist composition which has lowered sensitivity and tends to cause insolubilization of exposed portions upon developing.

(C) Phenolic Compound:

In the present invention, a compound [phenolic compound (CX)] having a structural unit represented by the formula (I) and a compound [phenolic compound (CD)] having a structural unit represented by the formula (II) are used as the phenolic compound of a modifier for the positive resist composition. The phenolic compounds (CX) and (CD) may be used singly. However, the combined use of both compounds permits the provision of a positive resist composition more improved in exposure margin and focus margin.

The phenolic compound (CX) can be obtained by condensing a phenol with an $\alpha,\alpha'$-disubstituted xylene in the presence of an acid catalyst. More specifically, such a phenolic compound (CX) can be synthesized in accordance with a process disclosed in, for example, Japanese Patent Publication No. 46917/1984 or Japanese Patent Application Laid-Open No. 116370/1994.

No particular limitation is imposed on the phenol used as a raw material for the phenolic compound (CX). However, preferable examples thereof include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol and isothymol. These compounds may be used either singly or in any combination thereof.

No particular limitation is imposed on the $\alpha,\alpha'$-disubstituted xylene. However, preferable examples thereof include o-xylylene glycol, m-xylylene glycol, p-xylylene glycol, o-divinylbenzene, m-divinylbenzene, p-divinylbenzene, o-xylylene glycol ditoluenesulfonate, m-xylylene glycol ditoluenesulfonate, p-xylylene glycol ditoluenesulfonate, o-xylylene glycol dimesylate, m-xylylene glycol dimesylate, p-xylylene glycol dimesylate, o-diisopropylbenzene, m-diisopropylbenzene, p-diisopropylbenzene, 2,3,5,6-tetramethyl-p-xylylene glycol, 2,5-dimethyl-p-xylylene glycol, α,α'-dimethoxy-p-xylene, α,α'-dimethoxy-m-xylene and α,α'-dimethoxy-o-xylene. These compounds may be used either singly or in any combination thereof.

Specific examples of such a phenolic compound (CX) include those shown in Table 1. $R^1$ to $R^{11}$ shown in Table 1 correspond to those defined in the formula (I). The phenolic compound (CX) contains at least one structural unit represented by the formula (I).

TABLE 1

| Formula (I) | C-1 | C-2 | C-3 | C-4 | C-5 | C-6 | C-7 | C-8 |
|---|---|---|---|---|---|---|---|---|
| $R^1$ | H | $CH_3$ | $CH_3$ | $CH_3$ | OH | OH | OH | Cyclohexyl |
| $R^2$ | H | H | $CH_3$ | $CH_3$ | H | $CH_3$ | OH | H |
| $R^3$ | H | H | H | $CH_3$ | H | H | H | H |
| $R^4$ | H | H | H | H | H* | H | H | H |
| $R^5$ | H | H | H | H | H | H | H | H |
| $R^6$ | H | H | H | H | H | H | H | H |
| $R^7$ | H | H | H | H | H | H | H | H |
| $R^8$ | H | H | H | H | H | H | H | H |
| $R^9$ | H | H | H | H | H | H | H | H |
| $R^{10}$ | H | H | H | H | H | H | H | H |
| $R^{11}$ | H | H | H | H | H | H | H | H |

As specific examples of the phenolic compound (CX), may be mentioned those having a structural unit represented by each of the following formulae (CX-I) to (CX-XVI):

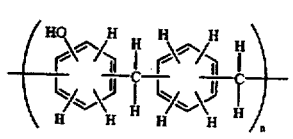
(CX-I)

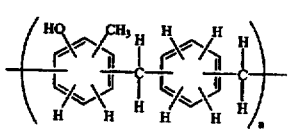
(CX-II)

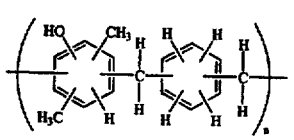
(CX-III)

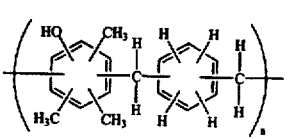
(CX-IV)

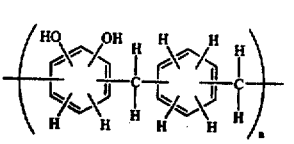
(CX-V)

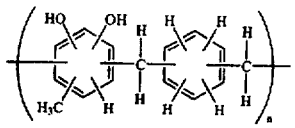
(CX-VI)

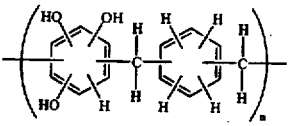
(CX-VII)

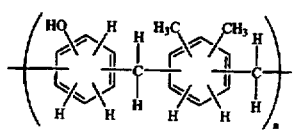
(CX-VIII)

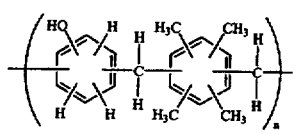
(CX-IX)

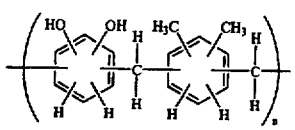
(CX-X)

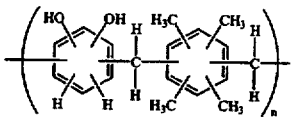
(CX-XI)

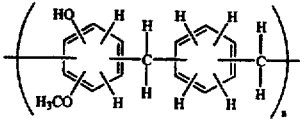
(CX-XII)

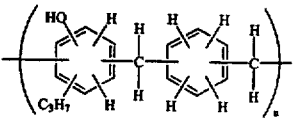
(CX-XIII)

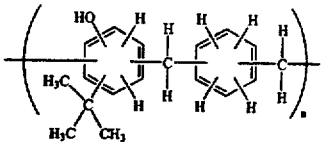
(CX-XIV)

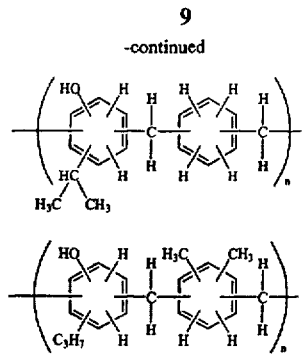

The phenolic compound (CD) can be obtained by subjecting a phenol and dicyclopentadiene to an addition reaction in the presence of an acid catalyst.

No particular limitation is imposed on the phenol used as a raw material for the phenolic compound (CD). However, preferable examples thereof include the same compounds as the phenol compounds which may be used as raw materials for the phenolic compounds (CX).

Dicyclopentadiene is a dimer of cyclopentadiene. Although two isomers of an endo form and an exo form exist in such a dimer, dicyclopentadiene used as a raw material for the phenolic compound (CD) (resin) useful in the practice of the present invention may be any isomer or may also be a mixture of the two isomers. When the mixture of the isomers is used, no particular limitation is imposed on the proportions of the isomers.

As the phenolic compound (CD), there may be used a compound obtained by reacting the phenol and dicyclopentadiene in coexistence with an aldehyde or ketone which is used as a raw material for a novolak resin. The aldehyde is preferably formaldehyde. When the aldehyde or ketone is used in combination, the proportion of dicyclopentadiene to be used is at least 20 parts by weight, preferably at least 50 parts by weight, more preferably at least 70 parts by weight, per 100 parts by weight of the total weight of the aldehyde, ketone and dicyclopentadiene.

Specific examples of such a phenolic compound (CD) include those shown in Tables 2 and 3. $R^{12}$ to $R^{15}$ shown in Tables 2 and 3 correspond to those defined in the formula (II). The phenolic compound (CD) contains at least one structural unit represented by the formula (II).

TABLE 2

| Formula (II) | D-1 | D-2 | D-3 | D-4 | D-5 | D-6 | D-7 | D-8 | D-9 |
|---|---|---|---|---|---|---|---|---|---|
| $R^{12}$ | OH | OH | OH | OH | OH | OH | OH | OH | OH |
| $R^{13}$ | H | $CH_3$ | $CH_3$ | $CH_3$ | OH | OH | OH | H | $OCH_3$ |
| $R^{14}$ | H | H | $CH_3$ | $CH_3$ | H | $CH_3$ | OH | H | H |
| $R^{15}$ | H | H | H | $CH_3$ | H | H | H | H | H |

TABLE 3

| Formula (II) | D-10 | D-11 | D-12 | D-13 | D-14 | D-15 | D-16 |
|---|---|---|---|---|---|---|---|
| $R^{12}$ | OH | OH | OH | OH | OH | OH | OH |
| $R^{13}$ | Cl | Phenyl | t-Butyl | t-Butyl | Phenyl-thio | 3-Pro-penyl | Cyclo-hexyl |
| $R^{14}$ | H | H | H | t-Butyl | H | H | H |
| $R^{15}$ | H | H | H | H | H | H | H |

No particular limitation is imposed on the weight average molecular weights (average molecular weight) of the phenolic compounds (CX) and (CD) useful in the practice of the present invention as determined in terms of polystyrene according to a GPC making use of a UV detector at 254 nm. Their average molecular weights may be optionally selected according to, for example, the kind and average molecular weight of the alkali-soluble phenol resin.

For example, when the phenolic compounds (CX) and (CD) are used as ordinary low-molecular phenolic compounds, the average molecular weights are generally lower than 2,000, preferably lower than 1,500. The concentration of portions having an average molecular weight of at least 2,000 is generally 40% or lower, preferably 30% or lower. When such low-molecular weight phenolic compounds (CX) and (CD) are used in combination with each other, the proportion of the phenolic compound (CD) to the phenolic compound (CX) is 0.1–10 times, preferably 0.2–5 times, more preferably 0.5–2 times.

When the phenolic compounds (CX) and (CD) are used as resins used in combination with the alkali-soluble phenol resin, the average molecular weights in the GPC charts of these resins are generally 2,000–25,000, preferably 3,500–20,000. The proportion (parts by weight) of the phenolic compounds (CX) and (CD) used as the resins used in combination with the alkali-soluble phenol resin is 0.1–10 times, preferably 0.5–5 times, more preferably 0.7–3 times as much as the alkali-soluble phenol resin.

The combined use of the phenolic compounds (CX) and (CD) in these proportions can achieve high exposure margin and focus margin. Of course, these phenolic compounds (CX) and (CD) may be used singly. In such a case, the molecular weight of the phenolic compound used is preferably lower.

It is allowable to use one of the phenolic compounds (CX) and (CD) as a resin and use the other as a low-molecular phenolic compound serving as an additive. In this case, the proportion of the alkali-soluble phenol resin to the phenolic compound (CX) or (CD) used as the resin used in combination with the alkali-soluble phenol resin and the proportion of additives, which will be described subsequently, to the phenolic compounds (CX) or (CD) used as the low-molecular phenolic compound are more important than the proportion of the phenolic compound (CX) to the phenolic compound (CD).

These phenolic compounds (CX) and (CD) may also be used after their molecular weights and molecular weight distributions are controlled by a known means. Methods of controlling the molecular weight and molecular weight distribution include the same methods as the above-described methods for controlling the molecular weight and molecular weight distribution of the alkali-soluble phenol resin.

(Additional Phenolic Compound)

In the present invention, a phenolic compound (hereinafter may be referred as "additional phenolic compound") other than the phenolic compounds (CX) and (CD) may be used in combination. High resist properties may be achieved in some cases by using an additional phenolic compound in combination. Specific examples of the additional phenolic compound usable in combination include monophenols such as p-phenylphenol and p-isopropylphenol; bisphenols such as biphenol, 4,4'-dihydroxydiphenyl ether, 4,4'-dihydroxybenzophenone, bisphenol A (product of Honshu Chemical Industry Co., Ltd.), bisphenol C (product of Honshu Chemical Industry Co., Ltd.), bisphenol E (product of Honshu Chemical Industry Co., Ltd.), bisphenol F (product of Honshu Chemical Industry Co., Ltd.), bisphenol AP (product of Honshu Chemical Industry Co., Ltd.), bisphenol M (product of Mitsui Petrochemical Industries, Ltd.), bisphenol P (product of Mitsui Petrochemical Industries, Ltd.), bisphenol Z (product of Honshu Chemical Industry Co., Ltd.), 1,1-bis(4-hydroxy-phenyl)cyclopentane, 9,9-bis(4-hydroxyphenyl)fluorene, 1,1-bis(5-methyl-2-hydroxyphenyl)methane and 3,5-dimethyl-4-hydroxybenzylphenol; trisphenols such as 1,1,1-tris(4-hydroxyphenyl)methane, 1,1,1-tris(4-hydroxyphenyl)ethane, 1,1-bis(3-methyl-4-hydroxyphenyl)-1-(4-hydroxyphenyl)methane, 1,1-bis(2,5-dimethyl-4-hydroxyphenyl)-1-(2-hydroxyphenyl)methane, 1,1-bis(3,5-dimethyl-4-hydroxyphenyl)-1-(2-hydroxyphenyl)methane, 2,6-bis(5-methyl-2-hydroxybenzyl)-4-methylphenol, 2,6-bis(4-hydroxybenzyl)-4-methylphenol, 2,6-bis(3-methyl-4-hydroxybenzyl)-4-methylphenol, 2,6-bis(3,5-dimethyl-4-hydroxybenzyl)-4-methylphenol, Trisphenol-PA (product of Honshu Chemical Industry Co., Ltd.) and Trisphenol-TC (product of Honshu Chemical Industry Co., Ltd.); tetrakisphenols such as 1,1,2,2-tetrakis(4-hydroxy-phenyl)ethane, 1,1,2,2-tetrakis(3-methyl-4-hydroxy-phenyl)ethane, 1,1,3,3-tetrakis(4-hydroxy-phenyl)propane, 1,1,5,5-tetrakis(4-hydroxyphenyl)pentane, α,α,α',α'-tetrakis(4-hydroxyphenyl)-3-xylene, α,α,α',α'-tetrakis(4-hydroxyphenyl)-4-xylene, α,α,α',α'-tetrakis-(3-methyl-4-hydroxyphenyl)-3-xylene and α,α,α',α'-tetrakis(3-methyl-4-hydroxyphenyl)-4-xylene; and pyrogallols such as pyrogallol and 5-methylpyrogallol. Of these, trisphenols, tetrakisphenols and pyrogallols are particularly preferred examples.

The proportion of these phenolic compounds (CX) and (CD) to be incorporated varies according to the composition, molecular weight and molecular weight distribution of the alkali-soluble phenol resin, the kinds and amounts of other additives, the average molecular weights of the phenolic compounds (CX) and (CD), and the like. However, with respect to the total amount of the low-molecular phenolic compounds having an average molecular weight lower than 2,000, the upper limit thereof is generally 100 parts by weight, preferably 60 parts by weight, more preferably 40 parts by weight, per 100 parts by weight of the total amount of the alkali-soluble phenol resin and the high-molecular weight phenolic compounds (CX) and/or (CD) used as a resin, while the lower limit thereof is generally 3 parts by weight, preferably 5 parts by weight, more preferably 10 parts by weight. The term "total amount of the low-molecular phenolic compounds having an average molecular weight lower than 2,000" as used herein means the whole weight of the additional phenolic compound if none of the phenolic compounds (CX) and (CD) having an average molecular weight lower than 2,000 are used, but denotes the whole weight of the phenolic compound (CX) and/or (CD) and the additional phenolic compound if the phenolic compound (CX) and/or (CD) having an average molecular weight lower than 2,000 is used. At this time, the weight ratio of the additional phenolic compound to the phenolic compound (CX) and/or (CD) having an average molecular weight lower than 2,000 is 0.5–5, preferably 0.3–3, more preferably 0.5–2.

(Solvent)

The positive resist composition according to the present invention is generally used in a state that it is dissolved in a solvent, in order to coat a substrate with the solution to form a resist film.

Specific examples of solvents usable in the present invention include ketones such as acetone, methyl ethyl ketone, cyclopentanone and cyclohexanone; alcohols such as n-propyl alcohol, isopropyl alcohol, n-butyl alcohol and cyclohexanol; ethers such as ethylene glycol dimethyl ether, ethylene glycol diethyl ether and dioxane; alcohol ethers such as ethylene glycol monomethyl ether and ethylene glycol monoethyl ether; esters such as propyl formate, butyl formate, propyl acetate, butyl acetate, methyl propionate, ethyl propionate, methyl butyrate, ethyl butyrate, methyl lactate and ethyl lactate; cellosolve esters such as cellosolve acetate, methyl cellosolve acetate, ethyl cellosolve acetate, propyl cellosolve acetate and butyl cellosolve acetate; propylene glycols such as propylene glycol, propylene glycol monomethyl ether acetate, propylene glycol monoethyl ether acetate and propylene glycol monobutyl ether; diethylene glycols such as diethylene glycol monomethyl ether, diethylene glycol monoethyl ether, diethylene glycol dimethyl ether and diethylene glycol diethyl ether; halogenated hydrocarbons such as trichloroethylene; aromatic hydrocarbons such as toluene and xylene; and polar solvents such as dimethylacetamide, dimethylformamide and N-methylacetamide. These solvents may be used either singly or in any combination thereof. These solvents are used in a sufficient amount to evenly dissolve the components (A) to (C) therein.

(Other Additives)

In order to improve the developability, storage stability and thermal-flow resistance of the positive resist composition according to the present invention, for example, a copolymer of styrene and acrylic acid, methacrylic acid or maleic anhydride, a copolymer of an alkene and maleic anhydride, a polymer of vinyl alcohol, a polymer of vinylpyrrolidone, rosin and/or shellac may be added to the positive resist composition as needed. The proportion of such polymers to be incorporated is 0–50 parts by weight, preferably 5–20 parts by weight per 100 parts by weight of the whole alkali-soluble phenol resin.

In the positive resist composition according to the present invention, may be contained one or more of compatible additives such as surfactants, storage stabilizers, sensitizers, anti-striation agents and plasticizers as needed.

Examples of the surfactants include polyoxyethylene alkyl ethers such as polyoxyethylene lauryl ether, polyoxyethylene stearyl ether and polyoxyethylene oleyl ether; polyoxyethylene aryl ethers such as polyoxyethylene octylphenyl ether and polyoxyethylene nonylphenyl ether; polyethylene glycol dialkyl esters such as polyethylene glycol dilaurate and polyethylene glycol distearate; fluorine-containing surfactants such as F TOP, EF301, EF303 and EF352 (products of New Akita Chemical Company), Megafac F171, F172, F173 and F177 (product of Dainippon Ink & Chemicals, Incorporated), Fluorad FC430 and FC431 (products of Sumitomo 3M Limited), and Asahiguard, AG716, Surflon S-382, SC-101, SC-102, SC103, SC-104, SC-105 and SC-106 (products of Asahi Glass Co., Ltd.); an organosiloxane polymer, KP341 (product of Shin-Etsu Chemical Co., Ltd.); and acrylic or methacrylic (co)polymers, Polyflow No. 75 and No. 95 (products of Kyoeisha Chemical Co., Ltd.). The amount of these surfactants to be incorporated is generally at most 2 parts by weight, preferably at most 1 part by weight, per 100 parts by weight of solids of the composition.

(Developer)

An aqueous solution of an alkali is generally used as an alkaline developer for the positive resist composition according to the present invention. Specific examples of the alkali solution include aqueous solutions of inorganic alkalis such as sodium hydroxide, potassium hydroxide, sodium silicate and ammonia; aqueous solutions of primary amines such as ethylamine and propylamine; aqueous solutions of secondary amines such as diethylamine and dipropylamine; aqueous solutions of tertiary amines such as trimethylamine and triethylamine; aqueous solutions of alcohol amines such as diethylethanolamine and triethanolamine; and aqueous solutions of quaternary ammonium hydroxides such as tetramethylammonium hydroxide, tetraethylammonium hydroxide, trimethylhydroxymethylammonium hydroxide, triethylhydroxymethylammonium hydroxide and trimethylhydroxyethylammonium hydroxide. A water-soluble organic solvent such as methanol, ethanol, propanol or ethylene glycol, a surfactant and a dissolution inhibitor for the resin may be further added to the aqueous alkali solution as needed.

A resist solution obtained by dissolving the resist composition according to the present invention in a solvent is applied onto the surface of a substrate such as a silicon wafer by a method known per se in the art and then dried to remove the solvent, whereby a resist film can be formed. As the coating method used at this time, spin coating can be recommended in particular.

Examples of an exposure source used in exposure for forming a pattern on the resist film thus obtained include sources for electron beams such as ultraviolet radiation, far ultraviolet radiation, KrF excimer laser beam, X-rays and electron beam. It is preferable to conduct a heat treatment (post-exposure bake) after the exposure because the sensitivity of the resist film can be more enhanced and stabilized.

EXAMPLES

The present invention will hereinafter be described more specifically by the following Synthesis Examples, Examples and Comparative Examples. Incidentally, all designations of "part" or "parts" and "%" as will be used in the following examples mean part or parts by weight and wt. % unless expressly noted.

In the following Examples and Comparative Examples, the resulting resist compositions were evaluated in accordance with the following methods. All the resist compositions were evaluated on a silicon wafer.

(1) Sensitivity:

Sensitivity is a value with an amount of exposure energy, by which a 1:1 line and space pattern at intervals of 0.60 μm can be formed to designed dimensions, expressed in terms of exposure time (unit: msec). Incidentally, in Examples 22–29 and Comparative Examples 5–8, a value with an amount of exposure energy, by which a 1:1 line and space pattern at intervals of 0.50 μm can be formed to designed dimensions, expressed in terms of exposure time (unit: msec) was regarded as sensitivity.

(2) Resolution:

A critical resolution (μm) under the above exposure conditions was expressed.

(3) Film loss after development:

A thickness ratio (%) of an unpatterned portion of a resist film on a silicon wafer after development to the unpatterned portion before the development was expressed.

(4) Pattern Profile:

A silicon wafer on which a resist pattern had been formed was cut in a direction perpendicular to the line pattern, and the pattern was observed through an electron microscope from the sectional direction. The result thereof was ranked as "Good" where the side wall of the pattern rose at an angle of at least 80 degrees to the substrate, and reduction in film thickness was not observed, or "Reduction in film" where reduction in film thickness was observed.

(5) Exposure Margin:

A line pattern was formed on a resist by means of a mask having 1:1 line and space dimensions of 0.40 μm with exposure energy varied to measure the pattern dimensions of the resist by means of an electron microscope for length measuring, thereby diagramming a relationship between the exposure energy and the pattern dimensions of the resist. Exposure energy values in pattern dimensions of 0.44 μm, 0.40 μm and 0.36 μm were determined as E1, E2 and E3, respectively. A value defined by the following equation was regarded as exposure margin.

$$\text{Exposure margin} = (E3 - E1) \times 100/E2.$$

(6) Focus Margin:

A line pattern was formed on a resist by means of a mask having 1:1 line and space dimensions of 0.40 μm with exposure energy and a focus upon exposure by a stepper varied to measure the dimensions of the resist pattern and observe its form. A range of focal changes, in which the dimensional change of the resist pattern was within +10% of the designed dimensions, the side wall of the pattern rose at an angle of at least 80 degrees, and reduction in film thickness was not observed, was regarded as focus margin.

[Synthesis Example 1] Synthesis of Novolak Resin (A-1)

A 2-liter flask equipped with a condenser and a stirrer was charged with 462 g of m-cresol, 308 g of p-cresol, 360 g of 37% formalin and 2.49 g of oxalic acid dehydrate. While holding the contents at 95–100° C., a reaction was conducted for 2 hours. Thereafter, water was distilled off over 2 hours at 100–105° C., and the pressure within the flask was reduced to 10 mmHg while further heating the reaction mixture up to 180° C., thereby removing unreacted monomers and water. The reaction mixture was then cooled down to room temperature to collect a product, thereby obtaining 515 g of Novolak Resin (A-1). The weight average molecular weight (Mw) of this Novolak Resin (A-1) was determined in terms of polystyrene by GPC and found to be 6,000.

[Synthesis Example 2] Synthesis of Novolak Resin (A-2)

Added to 380 g of the Novolak Resin (A-1) obtained in Synthesis Example 1 were 360 g of ethyl cellosolve acetate to dissolve the resin therein. A flask was equipped with a dropping funnel, and 950 g of toluene were added dropwise to the flask from the dropping funnel in the state that the temperature of the solution in the flask was controlled to 80–85° C. Thereafter, the resultant mixture was heated at 80° C. for 1 hour. The mixture was slowly cooled down to room temperature and left at rest further for 1 hour. After a supernatant of a resin deposited was removed by decantation, 570 g of ethyl lactate were added. The resultant mixture was heated to 100° C. under 100 mmHg to remove residual toluene, thereby obtaining a solution of Novolak Resin (A-2) in ethyl lactate. The weight average molecular weight (Mw) of this Novolak Resin (A-2) was determined in terms of polystyrene by GPC and found to be 9,800.

[Synthesis Example 3] Synthesis of Novolak Resin (A-3)

A 2-liter flask equipped with a condenser and a stirrer was charged with 280 g of m-cresol, 210 g of p-cresol, 265 g of 2,3,5-trimethylphenol, 368 g of 37% formalin and 2.49 g of oxalic acid dehydrate. While holding the contents at 95–100° C., a reaction was conducted for 2 hours.

Thereafter, water was distilled off over 2 hours at 100–105° C., and the pressure within the flask was reduced to 10 mmHg while further heating the reaction mixture up to 180° C., thereby removing unreacted monomers and water. The reaction mixture was then cooled down to room temperature to collect a product, thereby obtaining 675 g of Novolak Resin (A-3). The weight average molecular weight (Mw) of this Novolak Resin (A-3) was determined in terms of polystyrene by GPC and found to be 6,400.

[Synthesis Example 4] Synthesis of Novolak Resin (A-4)

Added to 380 g of the Novolak Resin (A-3) obtained in Synthesis Example 3 were 3,800 g of toluene to dissolve the resin therein. After the solution was heated at 80° C. for 1 hour, it was slowly cooled down to room temperature and left at rest further for 1 hour. After a supernatant of a resin deposited was removed by decantation, 570 g of ethyl lactate were added. The resultant mixture was heated to 100° C. under 100 mmHg to remove residual toluene, thereby obtaining a solution of Novolak Resin (A-4) in ethyl lactate. The weight average molecular weight (Mw) of this Novolak Resin (A-4) was determined in terms of polystyrene by GPC and found to be 9,800.

[Synthesis Example 5] Synthesis of Photosensitive Agent (B-1)

Novolak Resin (A-1) was used as a polyhydroxy compound, while a 10% solution of 1,2-naphthoquinonediazide-5-sulfonyl chloride obtained by dissolving the chloride in acetone was used as a quinonediazide sulfonic compound. A concentration of 1,2-naphthoquinone-diazide-5-sulfonyl chloride used was a mol % corresponding to an esterification degree of 40%. While controlling the temperature of a solution containing both compounds to 20–25° C., triethylamine in an amount corresponding to 1.2 equivalents of 1,2-naphthoquinone-diazide-5-sulfonyl chloride was added dropwise over 30 minutes. The mixture was held at the reaction temperature further for 2 hours to complete a reaction. After a salt deposited was separated by filtration, the reaction mixture was poured into a 0.2% aqueous solution of oxalic acid in an amount 10 times as much as the reaction mixture. Solids deposited were collected by filtration, washed with ion-exchanged water and dried to obtain Photosensitive Agent (B-1) of the quinonediazide sulfonate type.

[Synthesis Example 6] Synthesis of Photosensitive Agent (B-2)

Photosensitive Agent (B-2) of the quinonediazide sulfonate type was obtained in accordance with the same process as in Synthesis Example 5 except that a compound represented by the formula (III) in which $R^{16}$ and $R^{17}$ were H, and $R^{18}$, $R^{19}$, $R^{20}$ and $R^{21}$ were $CH_3$ was used as a polyhydroxy compound, and 1,2-naphthoquinonediazide-5-sulfonyl chloride was used in a mol % corresponding to an esterification degree of 70% as a quinonediazide sulfonic compound.

[Synthesis Example 7] Collection of Phenolic Compounds (CX-1 to CX-3)

Xylok Resins "XL-225-2L", "XL-225-3L" and "XL-2254L" produced by Mitsui Toatsu Chemicals, Inc. were separately subjected to a fractionation process making use of ethyl cellosolve acetate as a good solvent and toluene as a poor solvent. These three Xylok Resins are all phenolic compounds (CX) having a structural unit represented by the formula (I) in which $R^1$ to $R^{11}$ are hydrogen atoms though their molecular weight distributions are different from one another. As a result of the above fractionation process, three kinds of phenolic compounds (CX), in which the weight average molecular weights (Mw) as determined in terms of polystyrene according to a GPC pattern making use of a UV detector at 254 nm were different from one another, were obtained. More specifically, they are Phenolic Compound (CX-1) whose Mw is 750, Phenolic Compound (CX-2) whose Mw is 1,000 and Phenolic Compound (CX-3) whose Mw is 1,500.

[Synthesis Example 8] Collection of Phenolic Compounds (CX-4 to CX-6)

Xylok Resins "XL-225-2L" and "XL-225-3L" produced by Mitsui Toatsu Chemicals, Inc. were separately subjected to a fractionation process making use of ethyl cellosolve acetate as a good solvent and toluene as a poor solvent, thereby obtaining three kinds of phenolic compounds (CX), in which the weight average molecular weights (Mw) as determined in terms of polystyrene according to a GPC pattern making use of a UV detector at 254 nm were different from one another. More specifically, they are Phenolic Compound (CX-4) whose Mw is 750, Phenolic Compound (CX-5) whose Mw is 1,020 and Phenolic Compound (CX-6) whose Mw is 6,600.

[Synthesis Example 9] Collection of Phenolic Compounds (CD-1 to CD-3)

Dicyclopentadiene phenol resins "DPR-5000", "DPR-3000" and "DPR-5210" produced by Mitsui Toatsu Chemicals, Inc. were separately subjected to a fractionation process making use of ethyl cellosolve acetate as a good solvent and toluene as a poor solvent. The dicyclopentadiene phenol resins "DPR-5000" and "DPR-3000" are both copolymers of dicyclopentadiene and phenol though their molecular weight distributions are different from each other. The dicyclopentadiene phenol resin "DPR-5210" is a copolymer of dicyclopentadiene, formaldehyde and phenol. As a result of the above fractionation process, three kinds of phenolic compounds (CD), in which the weight average molecular weights (Mw) as determined in terms of polystyrene according to a GPC pattern making use of a UV detector at 254 nm were different from one another, were obtained. More specifically, they are Phenolic Compound (CD-1) whose Mw is 750, Phenolic Compound (CD-2) whose Mw is 1,200 and Phenolic Compound (CD-3) whose Mw is 1,800.

[Synthesis Example 10] Collection of Phenolic Compounds (CD-4 to CD-6)

Dicyclopentadiene phenol resins "DPR-3000", "DPR-5000" and "DPR-5210" produced by Mitsui Toatsu Chemicals, Inc. were separately subjected to a fractionation process making use of ethyl cellosolve acetate as a good solvent and toluene as a poor solvent in the same manner as in Synthesis Example 9, thereby obtaining three kinds of phenolic compounds (CD), in which the weight average molecular weights (Mw) as determined in terms of polystyrene according to a GPC pattern making use of a UV detector at 254 nm were different from one another. More specifically, they are Phenolic Compound (CD-4) whose Mw is 700, Phenolic Compound (CD-5) whose Mw is 1,500 and Phenolic Compound (CD-6) whose Mw is 5,800.

[Example 1]

A novolak resin, a photosensitive agent and Phenolic Compound (CX-1) obtained in Synthesis Example 7 were dissolved in 400 parts of ethyl lactate in accordance with its corresponding formulation shown in Table 4, and an amount of the solvent was controlled in such a manner that the resultant solution could be coated to a film thickness of 1.17 μm. This solution was filtered through a Teflon filter (polytetrafluoroethylene filter) having a pore size of 0.1 μm to prepare a resist solution.

After coating a silicon wafer with the thus-prepared resist solution by a spin coater, the resist solution was prebaked at 90° C. for 90 seconds, thereby forming a resist film having a thickness of 1.17 μm. The silicon wafer on which the resist film had been formed was exposed with exposure time varied using an i-ray stepper, "NSR-1755i7A" (manufactured by Nikon Corp., NA=0.50) and a test reticle. The thus-exposed wafer was then subjected to post-exposure baking at 110° C. for 60 seconds, followed by its development by the paddle process at 23° C. for 1 minute in a 2.38% aqueous solution of tetramethylammonium hydroxide to form a positive pattern. The silicon wafer on which the pattern had been formed was taken out of the aqueous solution to observe through an electron microscope, thereby determining its sensitivity, resolution, film loss after development and pattern profile. The results are shown in Table 4.

[Examples 2–9 and Comparative Examples 1–2]

Resist solutions were prepared in the same manner as in Example 1 except that the formulation in Example 1 was changed to their corresponding formulations shown in Table 4. Respective resist films were formed on silicon wafers from the resist solutions thus prepared to evaluate them. The results are shown in Table 4. Incidentally, in Example 9 and Comparative Examples 1 and 2, Trisphenol-PA (product of Honshu Chemical Industry Co., Ltd.) was used as the additional phenolic compound.

μm. This solution was filtered through a Teflon filter (polytetrafluoroethylene filter) having a pore size of 0.1 μm to prepare a resist solution.

After coating a silicon wafer with the thus-prepared resist solution by a spin coater, the resist solution was prebaked at 90° C. for 90 seconds, thereby forming a resist film having a thickness of 1.17 μm. The silicon wafer on which the resist film had been formed was exposed with exposure time varied using an i-ray stepper, "NSR-1755i7A" (manufactured by Nikon Corp., NA=0.50) and a test reticle. The thus-exposed wafer was then subjected to post-exposure baking at 110° C. for 60 seconds, followed by its development by the paddle process at 23° C. for 1 minute in a 2.38% aqueous solution of tetramethylammonium hydroxide to form a positive pattern. The silicon wafer on which the pattern had been formed was taken out of the aqueous solution to observe through an electron microscope, thereby

TABLE 4

| | Composition of positive resist | | | | | | | | Evaluation result | | | |
|---|---|---|---|---|---|---|---|---|---|---|---|---|
| | Novolak Resin | | Photosensitive agent | | Phenolic compound | | | Additive | | Sensitivity | Film loss after development | Resolution | Pattern |
| | Code | Parts | Code | Parts | Code | Mw | Parts | Kind | Parts | (msec) | (%) | (μm) | profile |
| Ex. 1 | A-2 | 80 | B-1 | 30 | CX-1 | 750 | 20 | — | — | 404 | 100 | 0.40 | Good |
| Ex. 2 | A-2 | 70 | B-1 | 30 | CX-2 | 1,000 | 30 | — | — | 390 | 100 | 0.40 | Good |
| Ex. 3 | A-1 | 85 | B-1 | 30 | CX-3 | 1,500 | 15 | — | — | 384 | 100 | 0.35 | Good |
| Ex. 4 | A-4 | 80 | B-1 | 30 | CX-1 | 750 | 20 | — | — | 422 | 100 | 0.35 | Good |
| Ex. 5 | A-4 | 70 | B-1 | 30 | CX-2 | 1,000 | 30 | — | — | 448 | 100 | 0.35 | Good |
| Ex. 6 | A-3 | 70 | B-1 | 30 | CX-3 | 1,500 | 30 | — | — | 416 | 100 | 0.40 | Good |
| Ex. 7 | A-4 | 80 | B-2 | 30 | CX-1 | 750 | 20 | — | — | 430 | 100 | 0.40 | Good |
| Ex. 8 | A-2 | 80 | B-2 | 30 | CX-2 | 1,000 | 20 | — | — | 420 | 100 | 0.40 | Good |
| Ex. 9 | A-4 | 70 | B-1 | 30 | CX-2 | 1,000 | 20 | TP-PA | 10 | 434 | 100 | 0.35 | Good |
| Comp. Ex. 1 | A-2 | 80 | B-1 | 30 | — | — | — | TP-PA | 20 | 454 | 96 | 0.45 | Reduction in film |
| Comp. Ex. 2 | A-2 | 80 | B-2 | 30 | — | — | — | TP-PA | 20 | 468 | 97 | 0.45 | Reduction in film |

(Note)
(1) TP-PA: Trisphenol PA.

From these results, it was found that when the phenolic compound (CX) is added, all the sensitivity, film loss after development, resolution and pattern profile of the resulting resist composition are improved. It was also found that when the additional phenolic compound is used in combination, the effect of the phenolic compound (CX) is further enhanced.

[Example 10]

A novolak resin, a photosensitive agent and Phenolic Compound (CD-1) obtained in Synthesis Example 9 were dissolved in 400 parts of ethyl lactate in accordance with its corresponding formulation shown in Table 5, and an amount of the solvent was controlled in such a manner that the resultant solution could be coated to a film thickness of 1.17 determining its sensitivity, resolution, film loss after development and pattern profile. The results are shown in Table 5.

[Examples 11–21 and Comparative Examples 3–4]

Resist solutions were prepared in the same manner as in Example 10 except that the formulation in Example 10 was changed to their corresponding formulations shown in Table 5. Respective resist films were formed on silicon wafers from the resist solutions thus prepared to evaluate them. The results are shown in Table 5. Incidentally, in Examples 16–21 and Comparative Examples 3 and 4, Trisphenol PA (product of Honshu Chemical Industry Co., Ltd.) or 1,1-bis(3,5-dimethyl-4-hydroxyphenyl)-1-(2-hydroxyphenyl)methane was used as the additional phenolic compound.

TABLE 5

| | Composition of positive resist | | | | | | | | Evaluation result | | | |
|---|---|---|---|---|---|---|---|---|---|---|---|---|
| | Novolak Resin | | Photosensitive agent | | Phenolic compound | | | Additive | | Sensitivity | Film loss after development | Resolution | Pattern |
| | Code | Parts | Code | Parts | Code | Mw | Parts | Kind | Parts | (msec) | (%) | (μm) | profile |
| Ex. 10 | A-2 | 80 | B-1 | 30 | CD-1 | 750 | 20 | — | — | 424 | 100 | 0.35 | Good |
| Ex. 11 | A-4 | 80 | B-2 | 30 | CD-1 | 750 | 20 | — | — | 438 | 100 | 0.35 | Good |

TABLE 5-continued

| | Composition of positive resist | | | | | | | | | Evaluation result | | | |
|---|---|---|---|---|---|---|---|---|---|---|---|---|---|
| | Novolak Resin | | Photosensitive agent | | Phenolic compound | | | Additive | | Sensitivity | Film loss after development | Resolution | Pattern |
| | Code | Parts | Code | Parts | Code | Mw | Parts | Kind | Parts | (msec) | (%) | (µm) | profile |
| Ex. 12 | A-2 | 70 | B-1 | 30 | CD-2 | 1,200 | 30 | — | — | 418 | 100 | 0.35 | Good |
| Ex. 13 | A-4 | 70 | B-2 | 30 | CD-2 | 1,200 | 30 | — | — | 426 | 100 | 0.35 | Good |
| Ex. 14 | A-2 | 60 | B-2 | 30 | CD-3 | 1,800 | 40 | — | — | 422 | 100 | 0.35 | Good |
| Ex. 15 | A-4 | 60 | B-2 | 30 | CD-3 | 1,800 | 40 | — | — | 440 | 100 | 0.35 | Good |
| Ex. 16 | A-2 | 80 | B-1 | 30 | CD-1 | 750 | 10 | TP-PA | 10 | 410 | 100 | 0.35 | Good |
| Ex. 17 | A-4 | 80 | B-2 | 30 | CD-1 | 750 | 10 | TP-PA | 10 | 426 | 100 | 0.35 | Good |
| Ex. 18 | A-2 | 80 | B-1 | 30 | CD-1 | 750 | 10 | DMHM | 10 | 418 | 100 | 0.35 | Good |
| Ex. 19 | A-4 | 80 | B-2 | 30 | CD-1 | 750 | 10 | DMHM | 10 | 430 | 100 | 0.35 | Good |
| Ex. 20 | A-2 | 70 | B-1 | 30 | CD-2 | 1,200 | 20 | TP-PA | 10 | 406 | 100 | 0.35 | Good |
| Ex. 21 | A-2 | 70 | B-2 | 30 | CD-2 | 1,200 | 20 | TP-PA | 10 | 418 | 100 | 0.35 | Good |
| Comp. Ex. 3 | A-2 | 80 | B-1 | 30 | — | — | — | TP-PA | 20 | 460 | 96 | 0.43 | Reduction in film |
| Comp. Ex. 4 | A-4 | 80 | B-2 | 30 | — | — | — | TP-PA | 20 | 478 | 98 | 0.43 | Reduction in film |

(Note)
(1) TP-PA: Trisphenol PA.
(2) DHPM: 1,1-Bis(3,5-dimethyl-4-hydroxyphenyl)-1-(2-hydroxyphenyl)methane.

From these results, it was found that when the phenolic compound (CD) having the structural unit represented by the formula (II) is used as the phenolic compound, the sensitivity, film loss after development, resolution and pattern profile of the resulting resist composition are improved.

[Example 22]

A novolak resin, a photosensitive agent, Phenolic Compound (CX-4) and Phenolic Compound (CD-5) were dissolved in 400 parts of ethyl lactate in accordance with a formulation for Resist Solution R1 shown in Table 6, and an amount of the solvent was controlled in such a manner that the resultant solution could be coated to a film thickness of 1.07 µm. This solution was filtered through a Teflon filter (polytetrafluoroethylene filter) having a pore size of 0.1 µm to prepare Resist Solution R1.

After coating a silicon wafer with the thus-prepared resist solution by a spin coater, the resist solution was prebaked at 90° C. for 90 seconds, thereby forming a resist film having a thickness of 1.07 µm. The silicon wafer on which the resist film had been formed was exposed with exposure time varied using an i-ray stepper, "NSR-1755i7A" (manufactured by Nikon Corp., NA=0.50) and a test reticle. The thus-exposed wafer was then subjected to post-exposure baking at 110° C. for 60 seconds, followed by its development by the paddle process at 23° C. for 1 minute in a 2.38% aqueous solution of tetramethylammonium hydroxide to form a positive pattern. The silicon wafer on which the pattern had been formed was taken out of the aqueous solution to observe through an electron microscope, thereby determining its sensitivity, resolution, film loss after development, pattern profile, exposure margin and focus margin. The results are shown in Table 7.

[Examples 23–28, 30–31 and Comparative Examples 5–6]

Resist Solutions (R2 to R11) were prepared in accordance with their corresponding formulations shown in Table 6 to form respective resist films on silicon wafers in the same manner as in Example 22, thereby evaluating them. The results are shown in Table 7.

[Example 29]

A positive resist, ZIR-9100 (product of Nippon Zeon Co., Ltd.) was coated on a silicon wafer in such a manner that a film thickness was 0.52 µm after baking under the following conditions. With respect to the baking conditions, the prebaking was conducted at 90° C. for 90 seconds using a hot plate, while the post-exposure baking was performed at 300° C. for 2 minutes. The refractive index of this silicon wafer on which the resist film had been formed was measured by means of a spectral ellipsometer to determine a reflectance of i-ray exposure light. As a result, the reflectance was found to be 1.7%.

Resist Solution R3 shown in Table 6 was coated on the silicon wafer (low-reflective substrate), on which the resist film had been formed, under such conditions that a film thickness was 1.06 µm, and the resist film thus formed was evaluated. The conditions for the coating and evaluation of the resist were the same as those used in Example 22.

[Comparative Example 7]

The evaluation was performed in the same manner as in Example 29 except that R9 was used as the resist solution in place of R3.

The formulations of the resist solutions according to Examples 22–31 and Comparative Examples 5–7, and the evaluation results thereof are shown in Table 6 and Table 7, respectively.

TABLE 6

| Resist solution | Novolak Resin | | Photosensitive agent | | Phenolic compound CX | | | Phenolic compound CD | | | Additive | |
|---|---|---|---|---|---|---|---|---|---|---|---|---|
| | Code | Parts | Code | Parts | Code | Mw | Parts | Code | Mw | Parts | Kind | Parts |
| R1 | A-2 | 70 | B-2 | 30 | CX-4 | 750 | 20 | CD-5 | 1,500 | 10 | — | — |
| R2 | A-2 | 70 | B-2 | 30 | CX-5 | 1,020 | 15 | CD-4 | 700 | 15 | — | — |
| R3 | A-4 | 30 | B-2 | 30 | CX-4 | 750 | 20 | CD-4 | 700 | 10 | — | — |

TABLE 6-continued

| Resist solution | Novolak Resin Code | Novolak Resin Parts | Photosensitive agent Code | Photosensitive agent Parts | Phenolic compound CX Code | Phenolic compound CX Mw | Phenolic compound CX Parts | Phenolic compound CD Code | Phenolic compound CD Mw | Phenolic compound CD Parts | Additive Kind | Additive Parts |
|---|---|---|---|---|---|---|---|---|---|---|---|---|
| R4  | A-2 | 30  | B-2 | 30 | CX-6 | 6,600 | 50 | CD-4 | 706   | 20 | —         | —  |
| R5  | A-2 | 30  | B-2 | 30 | CX-4 | 750   | 20 | CD-6 | 5,800 | 50 | —         | —  |
| R6  | A-2 | 65  | B-2 | 30 | CX-5 | 1,020 | 15 | CD-4 | 700   | 10 | TP-PA     | 10 |
| R7  | A-4 | 60  | B-2 | 30 | CX-4 | 750   | 20 | CD-5 | 1,500 | 10 | TP-PA     | 10 |
| R8  | A-1 | 100 | B-2 | 30 | —    | —     | —  | —    | —     | —  | —         | —  |
| R9  | A-2 | 100 | B-2 | 30 | —    | —     | —  | —    | —     | —  | TP-PA     | 10 |
| R10 | A-2 | 100 | B-2 | 30 | CX-4 | 750   | 30 | —    | —     | —  | —         | —  |
| R11 | A-4 | 100 | B-1 | 30 | CX-4 | 750   | 30 | CD-5 | 1,500 | 20 | Pyrogallol | 5  |

(Note) (1) TP-PA: Trisphenol PA.

TABLE 7

| | Resist solution | Sensitivity (msec) | Resolution (μm) | Film loss after development (%) | Pattern profile | Exposure margin (%) | Focus margin (%) |
|---|---|---|---|---|---|---|---|
| Ex. 22 | R1 | 420 | 0.34 | 100 | Good | 18 | 1.2 |
| Ex. 23 | R2 | 460 | 0.36 | 100 | Good | 19 | 1.1 |
| Ex. 24 | R3 | 380 | 0.34 | 100 | Good | 22 | 1.3 |
| Ex. 25 | R4 | 520 | 0.34 | 100 | Good | 20 | 1.1 |
| Ex. 26 | R5 | 480 | 0.34 | 100 | Good | 23 | 1.1 |
| Ex. 27 | R6 | 360 | 0.36 | 100 | Good | 20 | 1.2 |
| Ex. 28 | R7 | 340 | 0.36 | 100 | Good | 19 | 1.2 |
| Ex. 29 | R3 | 500 | 0.34 | 100 | Good | 26 | 1.3 |
| Ex. 30 | R10 | 440 | 0.36 | 100 | Good | 11 | 0.9 |
| Ex. 31 | R11 | 430 | 0.34 | 100 | Good | 24 | 1.3 |
| Comp. Ex. 5 | R8 | 420 | 0.44 | 98 | Reduction in film | 8 | 0.6 |
| Comp. Ex. 6 | R9 | 420 | 0.44 | 99 | Reduction in film | 10 | 0.8 |
| Comp. Ex. 7 | R9 | 520 | 0.40 | 99 | Reduction in film | 10 | 0.5 |

From these results, it was found that when the phenolic compound (CX) having the structural unit represented by the formula (I) and the phenolic compound (CD) having the structural unit represented by the formula (II) are used, the sensitivity, film loss after development, resolution, pattern profile, exposure margin and focus margin of the resulting resist composition are improved. It was also found that such a resist composition can achieve excellent sensitivity, exposure margin and focus margin, in particular, on a low-reflective substrate (Example 29).

INDUSTRIAL APPLICABILITY

Since the positive resist compositions according to the present invention are excellent in sensitivity, film loss after development, resolution, pattern profile, exposure margin and focus margin, they are useful as positive resists for minute processing to 1 μm or smaller in line width.

We claim:

1. A positive resist composition comprising in combination (A) an alkali-soluble phenol resin, (B) a quinonediazide sulfonate photosensitive agent and (C) a phenolic compound, wherein the phenolic compound (C) is at least one phenolic compound selected from the group consisting of phenolic compounds (CX) having a structural unit represented by the following formula (I) and a weight average molecular weight of at least 750 and phenolic compounds (CD) having a structural unit represented by the following formula (II):

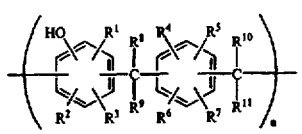
(I)

wherein $R^1$ and $R^3$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, $R^4$ to $R^{11}$ are, independently of one another, a hydrogen atom, an alkyl group which may be substituted, a cycloalkyl group which may be substituted, an alkenyl group which may be substituted, an aryl group which may be substituted, or an alkoxy group which may be substituted, and n is a positive integer; and

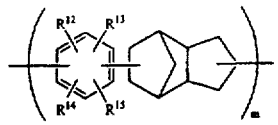
(II)

wherein $R^{12}$ to $R^{15}$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, with the proviso that at least one of $R^{12}$ to $R^{15}$ is a hydroxy group, and m is a positive integer.

2. The positive resist composition according to claim 1, wherein said at least one phenolic compound (C) selected from the group consisting of the phenolic compounds (CX) and the phenolic compounds (CD) is a low-molecular weight phenolic compound having a weight average molecular weight lower than 2,000 as determined in terms of polystyrene according to a GPC making use of a UV detector at 254 nm.

3. The positive resist composition according to claim 2, wherein the composition comprises 1–100 parts by weight of (B) the quinonediazide sulfonate type photosensitive agent and 3–100 parts by weight of (C) the low-molecular weight phenolic compound per 100 parts by weight of (A) the alkali-soluble phenol resin.

4. The positive resist composition according to claim 1, wherein a weight ratio of the high-molecular weight phenolic compound (C) to the alkali-soluble phenol resin (A) is within a range of 0.1–10.

5. The positive resist composition according to claim 4, wherein the composition comprises 1–100 parts by weight of (B) the quinonediazide sulfonate photosensitive agent per 100 parts by weight of (A) the alkali-soluble phenol resin.

6. The positive resist composition according to claim 1, wherein the composition comprises, as the phenolic compound (C), a high-molecular weight phenolic compound having a weight average molecular weight of 2,000–25,000 and a low-molecular weight phenolic compound having a weight average molecular weight lower than 2,000, both, as determined in terms of polystyrene according to a GPC making use of a UV detector at 254 nm.

7. The positive resist composition according to claim 6, wherein the high-molecular weight phenolic compound is a phenolic compound (CX), and the low-molecular weight phenolic compound is a phenolic compound (CD).

8. The positive resist composition according to claim 6, wherein the high-molecular weight phenolic compound is a phenolic compound (CD), and the low-molecular weight phenolic compound is a phenolic compound (CX).

9. The positive resist composition according to claim 1, wherein the composition further comprises, as the phenolic compound (C), an additional phenolic compound (E) in addition to said at least one phenolic compound selected from the group consisting of the phenolic compounds (CX) and the phenolic compounds (CD).

10. The positive resist composition according to claim 9, wherein the additional phenolic compound (E) is a trisphenol, tetrakisphenol or pyrogallol.

11. The positive resist composition according to claim 9 or 10, wherein a weight ratio of the additional phenolic compound (E) to the low-molecular weight phenolic compound, which is at least one phenolic compound selected from the group consisting of the phenolic compounds (CX) and the phenolic compounds (CD) and has a weight average molecular weight lower than 2,000 as determined in terms of polystyrene according to a GPC making use of a UV detector at 254 nm, is 0.1–5.

12. A positive resist composition comprising in combination (A) an alkali-soluble phenol resin, (B) a quinonediazide sulfonate photosensitive agent and (C) a phenolic compound, wherein the phenolic compound (C) is at least one phenolic compound selected from the group consisting of phenolic compounds (CX) having a structural unit represented by the following formula (I) and phenolic compounds (CD) having a structural unit represented by the following formula (II):

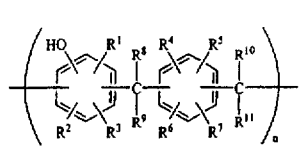

wherein $R^1$ to $R^3$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, $R^4$ to $R^{11}$ are, independently of one another, a hydrogen atom, an alkyl group, a cycloalkyl group, an alkenyl group, an unsubstitued aryl group, or an alkoxy group, and n is a positive integer; and

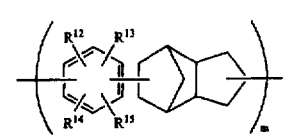

wherein $R^{12}$ to $R^{15}$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, with the proviso that at least one of $R^{12}$ to $R^{15}$ is a hydroxy group, and m is a positive integer.

13. A positive resist composition comprising in combination (A) an alkali-soluble phenol resin, (B) a quinonediazide sulfonate photosensitive agent and (C) a phenolic compound, wherein the phenolic compound (C) comprises at least one high molecular weight phenolic compound having a weight average molecular weight of 2,000–25,000 as determined in terms of polystyrene according to a GPC making use of a UV detector at 254 nm, and selected from the group consisting of phenolic compounds (CX) having a structural unit represented by the following formula (I) and phenolic compounds (CD) having a structural unit represented by the following formula (II):

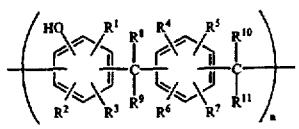

wherein $R^1$ to $R^3$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, $R^4$ to $R^{11}$ are, independently of one another, a hydrogen atom, an alkyl group which may be substituted, a cycloalkyl group which may be substituted, an alkenyl group which may be substituted, an aryl group which may be substituted, or an alkoxy group which may be substituted, and n is a positive integer; and

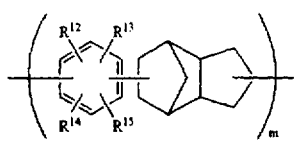

wherein $R^{12}$ to $R^{15}$ are, independently of one another, a hydrogen atom, a hydroxyl group, a halogen atom, an alkyl group which may be substituted, a cycloalkyl group which may be substituted, an alkenyl group which may be substituted, an alkoxy group which may be substituted, or an aryl group which may be substituted, with the proviso that at least one of $R^{12}$ to $R^{15}$ is a hydroxy group, and m is a positive integer.

14. The positive resist composition according to claim 13, wherein the composition comprises, as the phenolic compound (C), the high-molecular weight phenolic compound having a weight average molecular weight of 2,000–25,000 and a low-molecular weight phenolic compound having a weight average molecular weight lower than 2,000, both, as determined in terms of polystyrene according to a GPC making use of a UV detector at 254 nm.

15. The positive resist composition according to claim 14, wherein the high-molecular weight phenolic compound is a phenolic compound (CX), and the low-molecular weight phenolic compound is a phenolic compound of formula (II).

16. The positive resist composition according to claim 14, wherein the high-molecular weight phenolic compound is a phenolic compound (CD), and the low-molecular weight phenolic compound is a phenolic compound of formula (I).

* * * * *

UNITED STATES PATENT AND TRADEMARK OFFICE
CERTIFICATE OF CORRECTION

PATENT NO.    : 6,013,047
DATED         : January 11, 2000
INVENTOR(S)   : Shoji Kawata et al.

It is certified that error appears in the above-identified patent and that said Letters Patent is hereby corrected as shown below:

<u>Column 23,</u>
Line 20, change "claim 1" to -- claim 13 --.

Signed and Sealed this

Twenty-fifth Day of June, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO.    : 6,013,407
DATED         : January 11, 2000
INVENTOR(S)   : Shoji Kawata et al.

It is certified that error appears in the above-identified patent and that said Letters Patent is hereby corrected as shown below:

<u>Column 23,</u>
Line 20, change "claim 1" to -- claim 13 --.

This certificate supersedes Certificate of Correction issued June 25, 2002.

Signed and Sealed this

Twenty-fourth Day of December, 2002

JAMES E. ROGAN
*Director of the United States Patent and Trademark Office*